US011935931B2

(12) United States Patent
Xie et al.

(10) Patent No.: US 11,935,931 B2
(45) Date of Patent: Mar. 19, 2024

(54) SELECTIVE SHRINK FOR CONTACT TRENCH

(71) Applicant: International Business Machines Corporation, Armonk, NY (US)

(72) Inventors: Ruilong Xie, Niskayuna, NY (US); Jing Guo, Niskayuna, NY (US); Ekmini Anuja De Silva, Slingerlands, NY (US); Abraham Arceo de la Pena, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 16/894,774

(22) Filed: Jun. 6, 2020

(65) Prior Publication Data
US 2021/0384306 A1 Dec. 9, 2021

(51) Int. Cl.
*H01L 29/41* (2006.01)
*H01L 29/40* (2006.01)
*H01L 29/417* (2006.01)

(52) U.S. Cl.
CPC ...... *H01L 29/41775* (2013.01); *H01L 29/401* (2013.01); *H01L 29/413* (2013.01)

(58) Field of Classification Search
CPC ....... H01L 29/66545; H01L 21/823821; H01L 21/845; H01L 29/1054; H01L 29/66803; H01L 29/66818; H01L 29/7853; H01L 29/7854; H01L 29/51; H01L 29/10; H01L 29/78; H01L 21/28; H01L 29/785; H01L 21/823857; H01L 29/66795; H01L 21/28194; H01L 29/513; H01L 29/517; H01L 29/6681; H01L 21/02164; H01L 21/0217; H01L 21/02532; H01L 21/30604; H01L 21/762; H01L 29/0649; H01L 21/76224; H01L 21/8238–823892;
(Continued)

(56) References Cited

U.S. PATENT DOCUMENTS 6,501,108 B1 12/2002 Suzuki et al.
7,569,897 B2 8/2009 Anderson et al.
(Continued)

OTHER PUBLICATIONS

Anonymous, "A Structure for Forming a Contact with Improved Contact Resistance and Overlay Tolerance", IP.com No. 000226568, Apr. 16, 2013 (5 pages).
(Continued)

*Primary Examiner* — Moin M Rahman
(74) *Attorney, Agent, or Firm* — Michael J. Chang; Samuel A. Waldbaum

(57) ABSTRACT

Techniques for selective CD shrink for source and drain contact trench to optimize FET device performance are provided. In one aspect, a semiconductor FET device includes: at least one gate; source and drains on opposite sides of the at least one gate; recesses in the source and drains; and metal contacts disposed over the source and drains and in the recesses, wherein the metal contacts are in direct contact with a bottom and sidewalls of each of the recesses in both a first direction and a second direction, wherein the first direction is perpendicular to the at least one gate, and wherein the second direction is parallel to the at least one gate. A method of forming a semiconductor FET device is also provided.

14 Claims, 19 Drawing Sheets

(58) Field of Classification Search
CPC . H01L 27/092–0928; H01L 29/04–045; H01L 29/16–1608; H01L 29/18–185; H01L 29/22–2206; H01L 29/36–365; H01L 21/823493; H01L 21/823885; H01L 21/823412; H01L 29/66522; H01L 29/20–2006; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/823481; H01L 21/823807; H01L 21/823814; H01L 21/823842; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 21/28518; H01L 23/5329; H01L 27/0207; H01L 28/20; H01L 29/41783; H01L 21/02636; H01L 21/76802; H01L 21/76877; H01L 21/823828; H01L 23/528; H01L 27/0922; H01L 29/167; H01L 29/66636; H01L 29/7851; H01L 29/7846; H01L 29/165; H01L 21/76897; H01L 23/5226; H01L 23/53209; H01L 23/53238; H01L 21/76816; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/0332; H01L 21/823437; H01L 21/823475; H01L 24/16; H01L 29/7842; H01L 2224/16227; H01L 24/32; H01L 24/73; H01L 2224/32225; H01L 2224/73204; H01L 23/185; H01L 23/485
See application file for complete search history.

(56) References Cited

U.S. PATENT DOCUMENTS

| | | | |
|---|---|---|---|
| 8,471,343 | B2 | 6/2013 | Doris et al. |
| 8,853,862 | B2 | 10/2014 | Alptekin et al. |
| 9,406,804 | B2 | 8/2016 | Huang et al. |
| 9,466,722 | B2 | 10/2016 | Liu et al. |
| 9,666,533 | B1 * | 5/2017 | Basker ................ H01L 23/485 |
| 9,673,295 | B2 | 6/2017 | Levesque et al. |
| 9,768,062 | B1 | 9/2017 | Kittl et al. |
| 9,805,989 | B1 | 10/2017 | Adusumilli et al. |
| 9,847,390 | B1 | 12/2017 | Xie et al. |
| 10,347,744 | B1 | 7/2019 | Cheng et al. |
| 10,367,077 | B1 | 7/2019 | Loubet et al. |
| 10,586,872 | B2 | 3/2020 | Carr et al. |
| 2008/0265343 | A1 | 10/2008 | Greene et al. |
| 2011/0062502 | A1 * | 3/2011 | Yin ................ H01L 29/66545 257/E21.409 |
| 2013/0095629 | A1 | 4/2013 | Ando et al. |
| 2016/0104787 | A1 | 4/2016 | Kittl et al. |
| 2016/0148999 | A1 | 5/2016 | Ok et al. |
| 2016/0163807 | A1 | 6/2016 | Leobandung |
| 2018/0006159 | A1 | 1/2018 | Guillorn et al. |
| 2018/0090582 | A1 | 3/2018 | Adusumilli et al. |
| 2018/0219077 | A1 | 8/2018 | Wang et al. |
| 2019/0074362 | A1 * | 3/2019 | Lee ................ H01L 29/41766 |
| 2020/0135859 | A1 * | 4/2020 | Wan ................ H01L 21/823814 |
| 2020/0279918 | A1 * | 9/2020 | Wu ................ H01L 29/0673 |
| 2021/0036121 | A1 * | 2/2021 | Lim ................ H01L 29/78696 |

OTHER PUBLICATIONS

Anonymous, "Method and Structure of forming improved FinFET", IPCOM000255896D, Oct. 19, 2018 (8 pages).

* cited by examiner

SELECTIVE SHRINK FOR CONTACT TRENCH

FIELD OF THE INVENTION

The present invention relates to contact formation in semiconductor field-effect transistor (FET) devices, and more particularly, to techniques for selective critical dimension (CD) shrink for source and drain contact trench to optimize FET device performance.

BACKGROUND OF THE INVENTION

Ideally, a semiconductor field-effect transistor (FET) device contact should achieve a large contact area in order to reduce contact resistance, while at the same time having a small overall size to minimize gate-to-contact parasitic capacitance. However, achieving these goals becomes increasingly more challenging as device dimensions are further scaled.

For instance, one technique that has been employed to increase contact area and reduce contact resistance is to form wrap-around source and drain region contacts. A wrap-around contact approach is beneficial because it serves to increase the contact area without having to form a large contact trench. However, while this approach effectively increases the contact area/reduces the contact resistance, conventional wrap-around contact designs significantly increase the parasitic capacitance between the contact and the gate.

Alternatively, approaches such as the implementation of recessed source and drain contacts have been explored to increase the contact area. With this approach, a recess is formed within the source and drain epitaxy, followed by contact metallization. However, a drawback to a conventional recessed contact design is that the contact fully straps the source and drain epitaxy. By 'fully straps' it means that the size of the contact is larger or at least as large as the size of the source and drain epitaxy, so that the contact can fully cover the epitaxy region. The result is a high parasitic capacitance between the contact and the gate.

Therefore, improved source and drain contact designs that maximize contact area, while minimizing the overall contact footprint to reduce contact-to-gate parasitic capacitance, would be desirable.

SUMMARY OF THE INVENTION

The present invention provides techniques for selective critical dimension (CD) shrink for source and drain contact trench to optimize field-effect transistor (FET) device performance. In one aspect of the invention, a semiconductor FET device is provided. The semiconductor FET device includes: at least one gate; source and drains on opposite sides of the at least one gate; recesses in the source and drains; and metal contacts disposed over the source and drains and in the recesses, wherein the metal contacts are in direct contact with a bottom and sidewalls of each of the recesses in both a first direction and a second direction, wherein the first direction is perpendicular to the at least one gate, and wherein the second direction is parallel to the at least one gate.

In another aspect of the invention, a method of forming a semiconductor FET device is provided. The method includes: forming a structure including at least one gate, and source and drains on opposite sides of the at least one gate; forming recesses in the source and drains; and forming metal contacts over the source and drains and in the recesses, wherein the metal contacts are in direct contact with a bottom and sidewalls of each of the recesses in both a first direction and a second direction, wherein the first direction is perpendicular to the at least one gate, and wherein the second direction is parallel to the at least one gate.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for improved source and drain contact designs that maximize contact area, while minimizing the overall contact footprint and contact-to-gate parasitic capacitance. As will be described in detail below, a selective critical dimension (CD) shrink approach is employed for the source and drain contact trench etch to optimize field-effect transistor (FET) device performance To do so, an approach is employed whereby a sacrificial mask material is used to selectively reduce the size (i.e., critical dimension or CD) of the source and drain contact. Doing so advantageously reduces the parasitic capacitance. Namely, as provided above, with conventional contact designs, the size of the source and drain contacts is the same as the size of the source and drain epitaxy in order to fully strap the source and drain. Here, the size of the source and drain contact is reduced. As will be described in detail below, the present techniques employ a functionalized self-aligned material (SAM)/polymer brush material that selectively binds to the OPL.

An exemplary methodology for forming a semiconductor device in accordance with the present techniques is now described by way of reference to FIGS. 1-20. As will become apparent from the description that follows, this process will be implemented to form a semiconductor FET device having a gate and recessed source and drains, interconnected by a channel, on opposite sides of the gate. Metal contacts will be formed over the recessed source and drains that are in direct contact with both the bottom and sidewalls of the recessed source and drains to maximize contact area.

Figure 1:
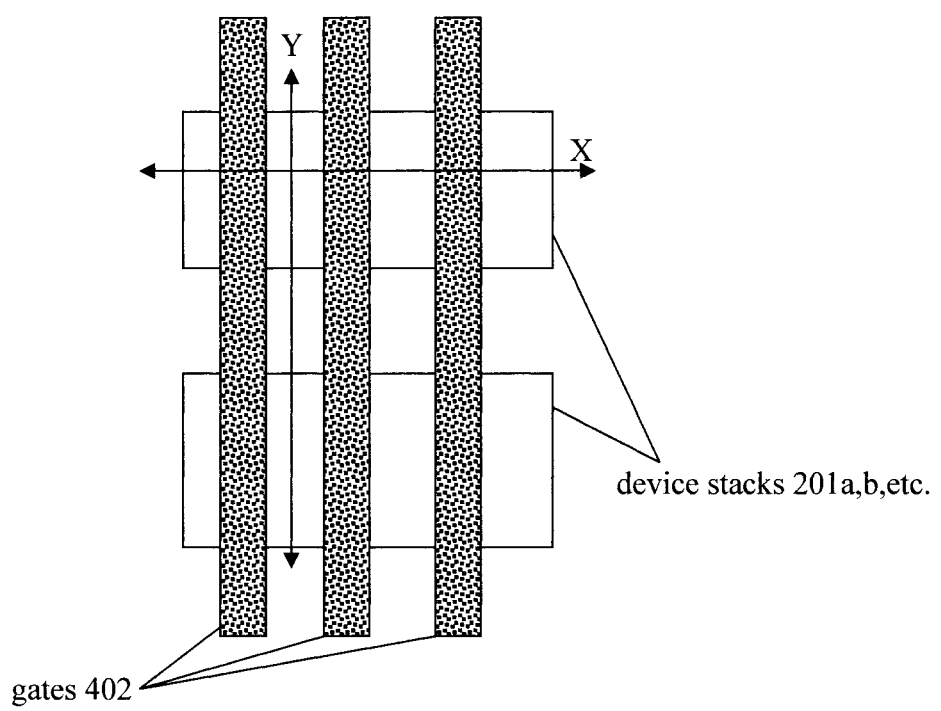
FIG. 1 is a top-down view of the general semiconductor field-effect transistor (FET) design presented herein having device stacks and gates oriented orthogonal to the device stacks according to an embodiment of the present invention.

In each of the following figures, a cross-sectional view through a part of the semiconductor FET device will be depicted. See, for example, FIG. 1 which shows a top-down view of the general semiconductor FET device design illustrating the orientations of the various cuts through the device that will be depicted in the figures. Referring to FIG. 1, in one exemplary embodiment, the present semiconductor FET device design includes device stacks of sacrificial and active layers, with gates of the semiconductor FET device oriented orthogonal to the device stacks. Sacrificial gates are shown in FIG. 1. Namely, as will be described in detail below, a replacement metal gate or RMG process is employed herein where these sacrificial gates serve as placeholders during source and drain formation, and then are later replaced with the replacement metal gates. However, the orientation of the gates with respect to the device stack is the same for both the sacrificial and replacement metal gates.

Figure 2:
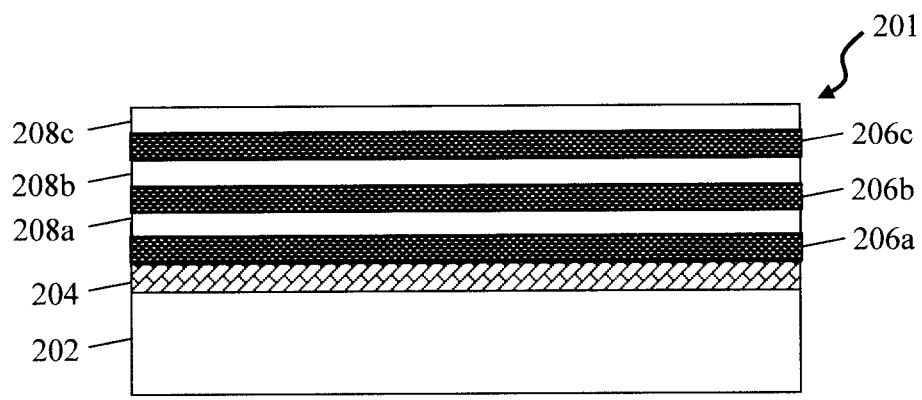
FIG. 2 is a cross-sectional diagram illustrating a stack of sacrificial and active layers having been formed on a substrate according to an embodiment of the present invention.

As shown in FIG. 1, a cross-section X will provide views of cuts through the center of one of the device stacks perpendicular to the gates. A cross-section Y will provide views of cuts through the device stacks between two of the gates in a source and drain region of the device. For instance, as shown in FIG. 2 (a cross-sectional view Y), the process begins with the formation of a stack 201 of sacrificial and active layers on a substrate 202. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

According to an exemplary embodiment, formation of stack 201 involves first depositing sacrificial and active layers, oriented horizontally one on top of another on substrate 202. By way of example only, in one exemplary embodiment, the sacrificial and active layers are nanosheets that are formed as a stack on substrate 202. The term 'nanosheet,' as used herein, generally refers to a sheet or a layer having nanoscale dimensions. Further, the term 'nanosheet' is meant to encompass other nanoscale structures such as nanowires. For instance, the term 'nanosheet' can refer to a nanowire with a larger width, and/or the term 'nanowire' can refer to a nanosheet with a smaller width, and vice versa.

As shown in FIG. 2, the stack 201 specifically includes a (first) sacrificial layer 204 deposited on the substrate 202, and alternating layers of (second) sacrificial layers 206a,b,c, etc. and active layers 208a,b,c, etc. deposited on sacrificial layer 204. The term 'sacrificial' as used herein refers to a structure that is removed, in whole or in part, during fabrication of the semiconductor FET device. By contrast, active layers active layers 208a,b,c, etc. will remain in place and serve as channels of the semiconductor FET device. It is notable that the number of sacrificial layers 206a,b,c, etc. and active layers 208a,b,c, etc. shown in the figures is provided merely as an example to illustrate the present techniques. For instance, embodiments are contemplated herein where more or fewer sacrificial layers 206a,b,c, etc. and/or more or fewer active layers 208a,b,c, etc. are present than is shown.

According to an exemplary embodiment, the sacrificial layer 204 and each of the sacrificial layers 206a,b,c, etc./active layers 208a,b,c, etc. are deposited/formed on substrate 202 using an epitaxial growth process. In one exemplary embodiment, the sacrificial layer 204 and the sacrificial layers 206a,b,c, etc./active layers 208a,b,c, etc. each have a thickness of from about 10 nanometers (nm) to about 25 nm and ranges therebetween.

The materials employed for sacrificial layers 206a,b,c, etc. and active layers 208a,b,c, etc. are such that the sacrificial layers 206a,b,c, etc. can be removed selective to the active layers 208a,b,c, etc. during fabrication. Further, as will be described in detail below, the material employed for sacrificial layer 204 needs to be such that sacrificial layer 204 can be removed selective to sacrificial layers 206a,b,c, etc. during fabrication in order to form a bottom dielectric isolation layer. A bottom dielectric isolation layer serves to prevent source-to-drain leakage via the substrate 202.

For instance, according to an exemplary embodiment, sacrificial layer 204 and sacrificial layers 206a,b,c, etc. are each formed from SiGe, while active layers 208a,b,c, etc. are formed from Si. Etchants such as wet hot SC1, vapor phase hydrogen chloride (HCl), vapor phase chlorine trifluoride (ClF$_3$) and other reactive clean processes (RCP) are selective for etching of SiGe versus Si.

Further, high germanium (Ge) content SiGe can be removed selective to low Ge content SiGe using an etchant such as dry HCl. Thus, according to an exemplary embodiment, sacrificial layer 204 is formed from SiGe having a high Ge content. For instance, in one exemplary embodiment, a high Ge content SiGe is SiGe having from about 50% Ge to about 100% Ge (i.e., pure Ge) and ranges therebetween. For instance, in one non-limiting example, sacrificial layer 204 is formed from SiGe60 (which is SiGe having a Ge content of about 60%). Use of a higher Ge content SiGe will enable the sacrificial layer 204 to be etched selective to sacrificial layers 206a,b,c, etc. when forming the bottom dielectric isolation layer (see below). In that case, sacrificial layers 206a,b,c, etc. are preferably formed from a low Ge content SiGe. For instance, in one exemplary embodiment, a low Ge content SiGe is SiGe having from about 20% Ge to about 50% Ge and ranges therebetween. For instance, in one non-limiting example, sacrificial layers 206a,b,c, etc. are formed from SiGe30 (which is SiGe having a Ge content of about 30%).

Standard lithography and etching techniques are then employed to pattern the sacrificial layer 204, sacrificial layers 206a,b,c, etc. and active layers 208a,b,c, etc. of stack 201 into individual device stacks 201a,b, etc. See FIG. 3 (a cross-sectional view Y). With standard lithography and etching processes, a lithographic stack (not shown), e.g., photoresist/organic planarizing layer (OPL)/anti-reflective coating (ARC), is used to pattern a hardmask (not shown) with the footprint and location of each of the device stacks 201a,b, etc. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask to the underlying stack of sacrificial and active layers. A directional (anisotropic) etching process such as reactive ion etching (RIE) can be employed for the stack etch.

Figure 3:
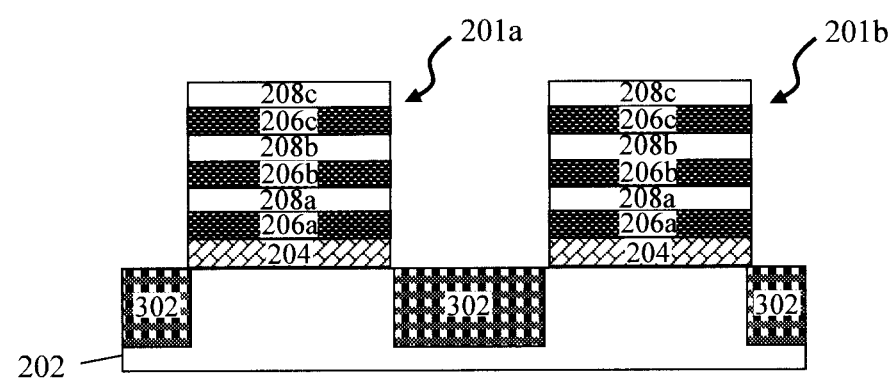
FIG. 3 is a cross-sectional diagram illustrating the stack having been patterned into individual device stacks, and shallow trench isolation (STI) regions having been formed in the substrate in between the device stacks from a view parallel to/in between the gates according to an embodiment of the present invention.

As shown in FIG. 3, shallow trench isolation (STI) regions 302 are next formed in the substrate 202 in between the device stacks 201a,b, etc. STI regions 302 serve to isolate the device stacks 201a,b, etc. The process to form STI regions 302 generally includes patterning trenches in the substrate 202, and then filling the trenches with a dielectric such as an oxide (which may also be generally referred to herein as an 'STI oxide'). Although not explicitly shown in the figures, a liner (e.g., a thermal oxide or silicon nitride (SiN)) may be deposited into the trenches prior to the STI oxide. Suitable STI oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be used to deposit the STI oxide, after which the STI oxide can be planarized using a process such as chemical mechanical polishing (CMP). After that, the STI oxide is recessed using a dry or wet etch process to reveal the device stacks 201a,b, etc.

Figure 4A:
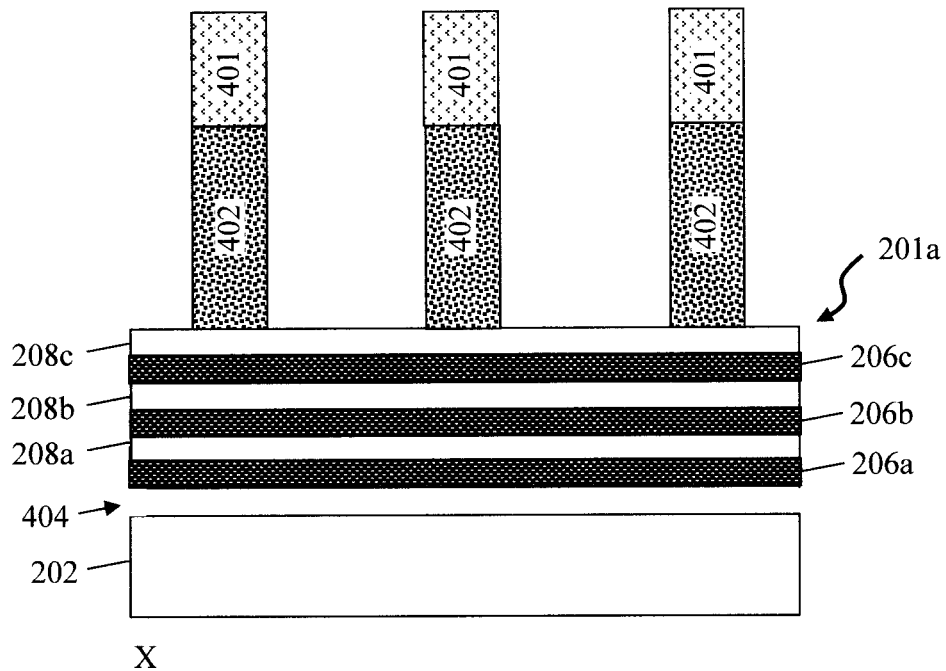
FIG. 4A is a cross-sectional diagram illustrating sacrificial gate hardmasks and sacrificial gates having been formed on the device stacks, and a first sacrificial layer having been selectively removed forming a cavity at the bottom of the device stacks from a view perpendicular to the gates.
Figure 4B:
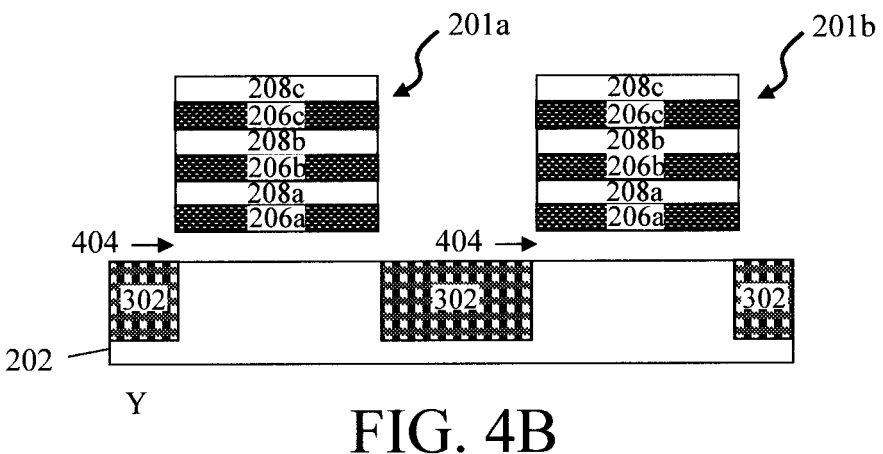
FIG. 4B is a cross-sectional diagram illustrating the first sacrificial layer having been selectively removed forming the cavity at the bottom of the device stacks from a view parallel to/in between the gates according to an embodiment of the present invention.

Next, sacrificial gates 402 are formed on the device stacks 201a,b, etc. over channel regions of the semiconductor FET device, after which the sacrificial layer 204 is selectively removed. See FIG. 4A (a cross-sectional view X). It is notable that FIG. 4A provides a view of a cut through device stack 201a. However, the process flow is the same for device stack 201b. To form sacrificial gates 402, a sacrificial gate material is first blanket deposited over the device stacks 201a,b, etc. Suitable sacrificial gate materials include, but are not limited to, poly-silicon (poly-Si) and/or amorphous silicon (a-Si). A process such as CVD, ALD or PVD can be employed to deposit the sacrificial gate material over the device stacks 201a,b, etc. According to an exemplary embodiment, a thin (e.g., from about 1 nanometer (nm) to about 3 nm) layer of silicon oxide (SiOx) is first formed on the device stacks 201a,b, etc., followed by the poly-Si and/or a-Si.

Sacrificial gate hardmasks 401 are then formed on the sacrificial gate material marking the footprint and location of each of the sacrificial gates 402. Suitable materials for the sacrificial gate hardmasks 401 include, but are not limited to, nitride hardmask materials such as SiN, SiON and/or silicon carbide nitride (SiCN), and/or oxide hardmask materials such as SiOx. An etch using the sacrificial gate hardmasks 401 is then used to pattern the sacrificial gate material into the individual sacrificial gates 402 shown in FIG. 4A. A directional (anisotropic) etching process such as RIE can be employed for the sacrificial gate etch.

As highlighted above, sacrificial gates 402 will serve as a placeholder for the final gates of the semiconductor FET device. Specifically, sacrificial gates 402 will be removed later on in the process and replaced with metal gate stacks that will serve as the final gates of the semiconductor FET device. Thus, these final gates of the semiconductor FET device are also referred to herein as "replacement metal gates" or simply "RMG." Use of a replacement metal gate process is advantageous because it prevents exposure of the metal gate stack materials to potentially damaging conditions during subsequent processing steps. For instance, the high-κ dielectrics used in the replacement metal gate stacks can be damaged by exposure to high temperatures. Thus, these gate stack materials are only placed near the end of the process.

The sacrificial layer 204 is then selectively removed, and then later replaced with a bottom dielectric isolation layer (see below). As provided above, sacrificial layer 204 can be formed from high Ge content SiGe (e.g., SiGe having from about 50% Ge to about 100% Ge (i.e., pure Ge) and ranges therebetween, such as SiGe60). In that case, an etchant such as dry HCl can be used to remove sacrificial layer 204 forming a cavity 404 at the bottom of the device stacks 201a,b, etc.

In the cross-sectional view Y, the sacrificial gates 402 are not visible. However, FIG. 4B (cross-sectional view Y) illustrates the sacrificial layer 204 having been selectively removed forming cavity 404 at the bottom of the device stacks 201a,b, etc. from another perspective, i.e., through adjacent device stacks 201a,b, etc. between two of the sacrificial gates 402.

Figure 5A:
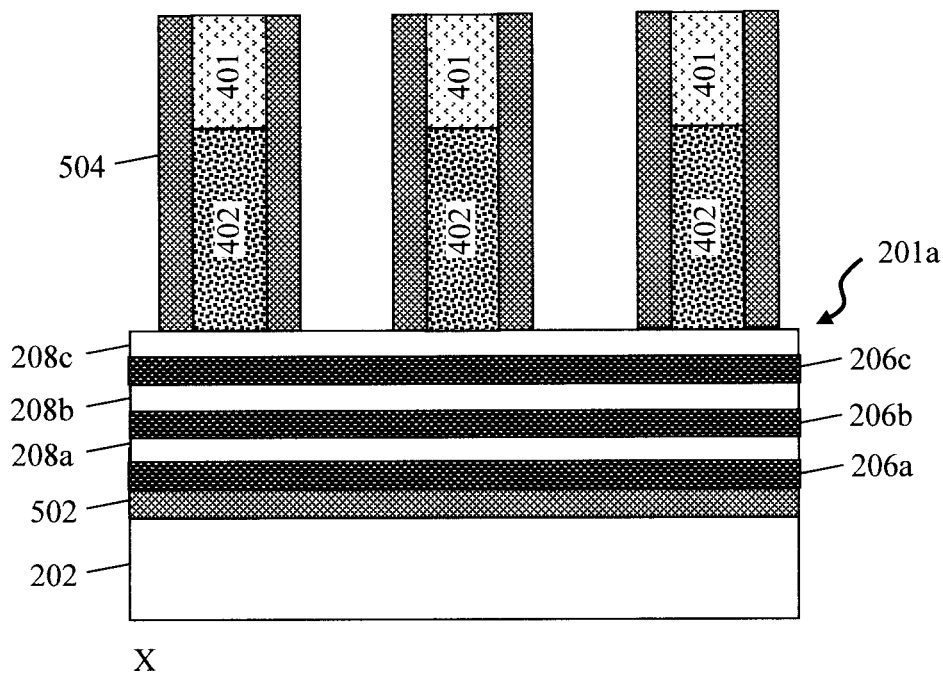
FIG. 5A is a cross-sectional diagram illustrating a bottom dielectric isolation layer having been formed in the cavity and dielectric spacers having been formed alongside the sacrificial gate hardmasks and sacrificial gates from a view perpendicular to the gates.

As shown in FIG. 5A (a cross-sectional view X), a dielectric material is deposited over the device structure and into/filling the cavity 404, followed by a directional (anisotropic) etching process such as RIE to pattern the dielectric spacer material into a bottom dielectric isolation layer 502 in the cavity 404 and dielectric spacers 504 alongside the sacrificial gate hardmasks 401 and sacrificial gates 402. Although not visible in this depiction, this process will also result in the dielectric spacers 504 being present alongside the adjacent device stacks 201a and 201b in the cross-sectional view Y (see FIG. 5B, described below). Suitable materials for dielectric spacers 504 include, but are not limited to, SiOx, SiC, SiCO and/or SiN. A process such as CVD, ALD or PVD can be employed to deposit the dielectric spacer material. As highlighted above, the bottom dielectric isolation layer 502 is used to prevent source-to-drain leakage via the substrate 202.

Figure 5B:
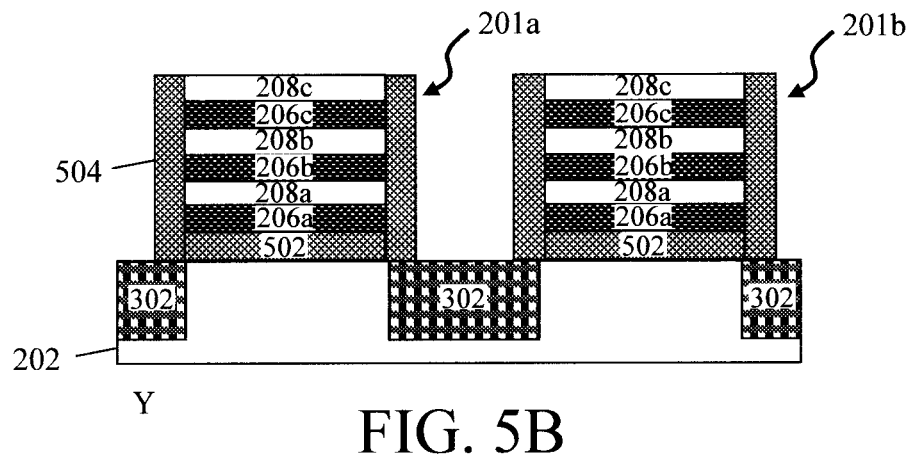
FIG. 5B is a cross-sectional diagram illustrating the bottom dielectric isolation layer having been formed in the cavity and the dielectric spacers having been formed alongside the adjacent device stacks from a view parallel to/in between the gates according to an embodiment of the present invention.

FIG. 5B (a cross-sectional view Y) illustrates the bottom dielectric isolation layer 502 and dielectric spacers 504 having been formed from another perspective, i.e., through adjacent device stacks 201a,b, etc. between two of the sacrificial gates 402. As shown in FIG. 5B, the dielectric spacers 504 have been formed alongside the adjacent device stacks 201a and 201b.

Figure 6A:
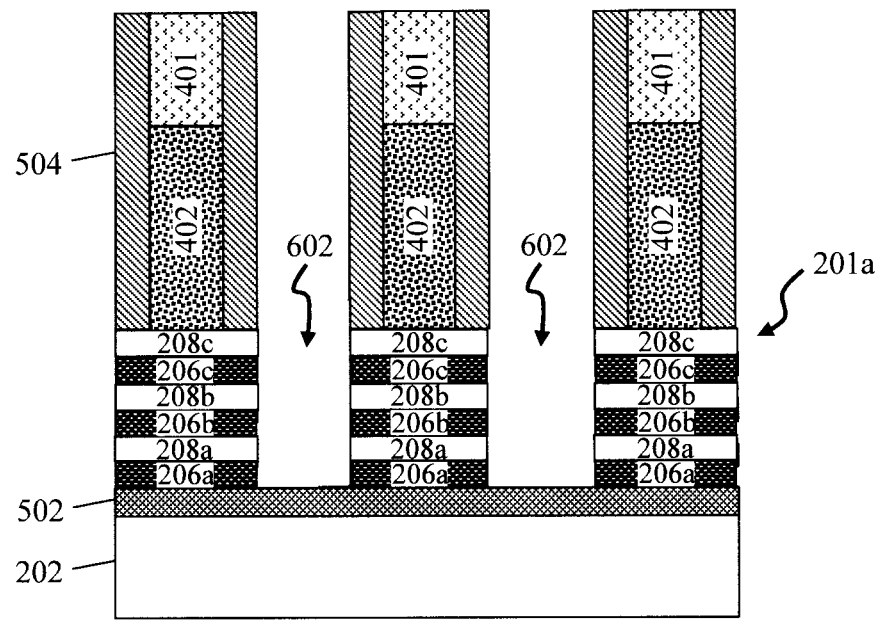
FIG. 6A is a cross-sectional diagram illustrating the sacrificial gates and dielectric spacers having been used as a mask to pattern trenches in the device stacks in between the sacrificial gates from a view perpendicular to the gates.
Figure 6B:
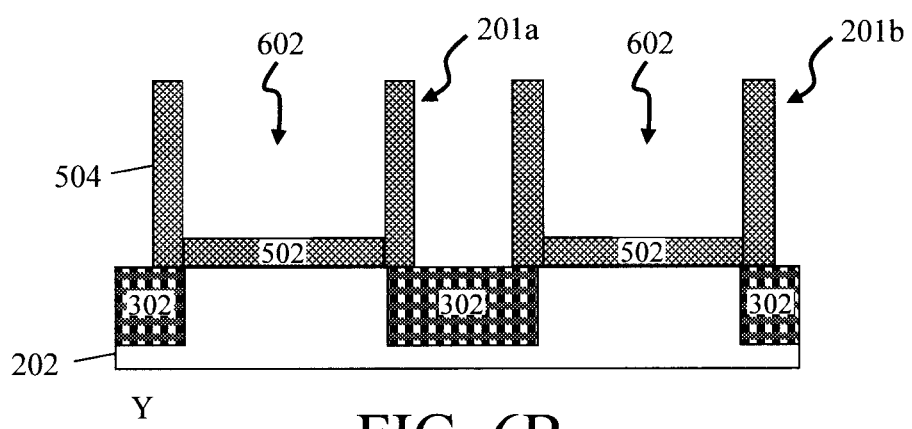
FIG. 6B is a cross-sectional diagram illustrating the trenches having been patterned in the device stacks from a view parallel to/in between the gates according to an embodiment of the present invention.

Sacrificial gates 402 and dielectric spacers 504 are then used as a mask to pattern trenches 602 in the device stacks 201a,b, etc. in between the sacrificial gates 402. See FIG. 6A (a cross-sectional view X). A directional (anisotropic) etching process such as RIE can be employed for the trench etch. As shown in FIG. 6A, trenches 602 extend through each of the sacrificial layers 206a,b,c, etc. and active layers 208a, b,c, etc., stopping on bottom dielectric isolation layer 502. FIG. 6B (cross-sectional view Y) illustrates trenches 602 having been formed in the device stacks 201a,b, etc. from another perspective, i.e., through adjacent device stacks 201a,b, etc. between two of the sacrificial gates 402.

Source and drains are then formed in the trenches 602 on opposite sides of the sacrificial gates 402 alongside the sacrificial layers 206a,b,c, etc. and active layers 208a,b,c, etc. First, however, inner spacers 702 are formed alongside the sacrificial layers 206a,b,c, etc. To do so, a selective lateral etch is performed to recess the sacrificial layers 206a,b,c, etc. exposed along the sidewalls of trenches 602. See FIG. 7A (a cross-sectional view X). This recess etch forms pockets along the sidewalls of the trenches 602 that are then filled with a spacer material to form inner spacers 702 within the pockets. These inner spacers 702 will offset the replacement metal gates from the source and drains 704

(see below). As provided above, according to an exemplary embodiment, the sacrificial layers 206a,b,c, etc. are formed from SiGe. In that case, a SiGe-selective non-directional (isotropic) etching process can be used for the recess etch. Suitable spacer materials for inner spacers 702 include, but are not limited to, silicon nitride (SiN), SiOx, SiC and/or SiCO. A process such as CVD, ALD or PVD can be employed to deposit the spacer material into the pockets, after which excess spacer material can be removed from the trenches 602 using an isotropic etching process such as RIE.

Source and drains 704 are then formed in the trenches 602 on opposite sides of the sacrificial gates 402 alongside the sacrificial layers 206a,b,c, etc. and active layers 208a,b,c, etc. According to an exemplary embodiment, source and drains 704 are formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 702 in place along the sidewalls of trenches 602, epitaxial growth of the source and drains 704 is templated only from the ends of the active layers 208a,b,c, etc. along the sidewalls of trenches 602.

Figure 7A:
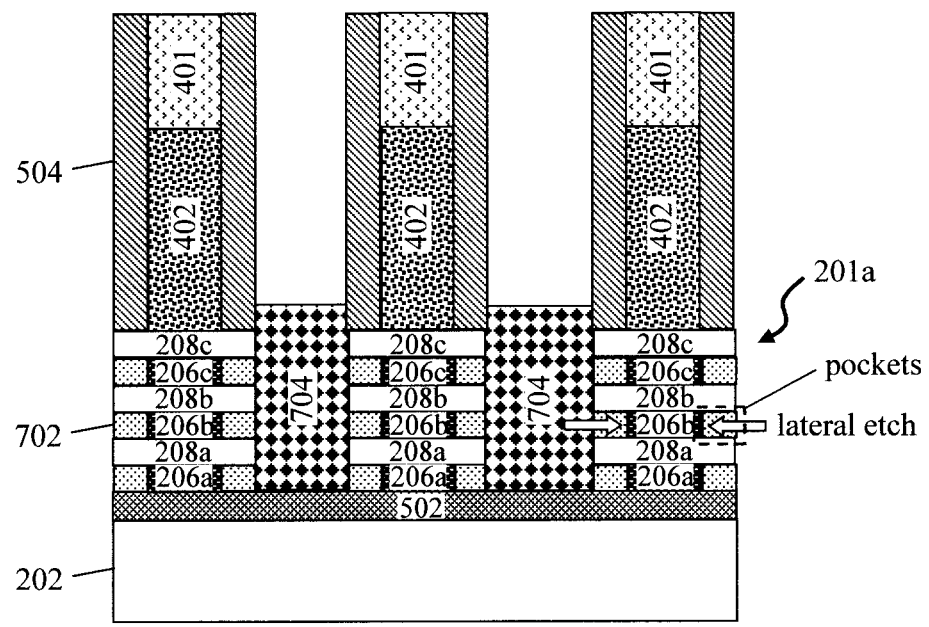
FIG. 7A is a cross-sectional diagram illustrating inner spacers having been formed alongside second sacrificial layers in the stack, and source and drains having been formed in the trenches on opposite sides of the sacrificial gates from a view perpendicular to the gates.
Figure 7B:
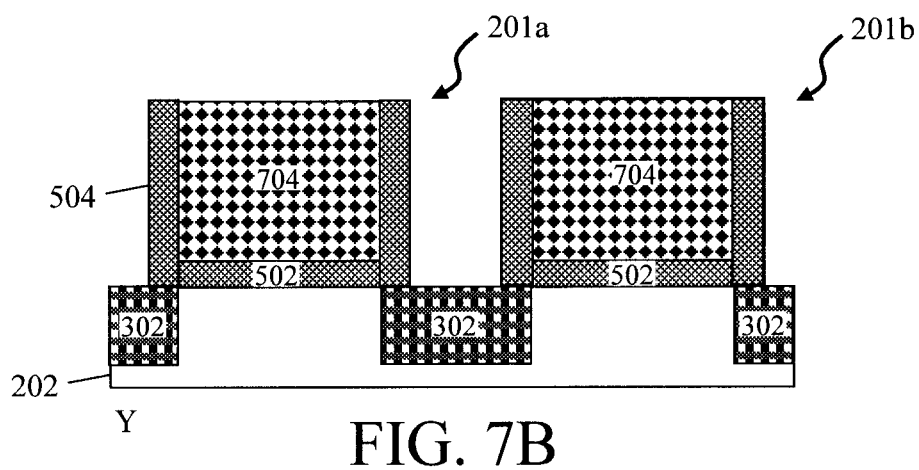
FIG. 7B is a cross-sectional diagram illustrating the source and drains having been formed from a view parallel to/in between the gates according to an embodiment of the present invention.

FIG. 7B (a cross-sectional view Y) illustrates the source and drains 704 having been formed from another perspective, i.e., between two of the sacrificial gates 402 and through the source and drain epitaxy. As shown in FIG. 7B, source and drains 704 are separated from the substrate 202 by the bottom dielectric isolation layer 502.

Following formation of the source and drains 704, the sacrificial gate hardmasks 401 and sacrificial gates 402 are then selectively removed. To do so, the sacrificial gates 402 are first surrounded in an interlayer dielectric (ILD) 802. Suitable ILD materials include, but are not limited to, oxide low-κ materials such as SiOx and/or oxide ULK-ILD materials such as pSiCOH. A process such as CVD, ALD or PVD can be employed to deposit ILD 802 around the sacrificial gates 402. Following deposition, ILD 802 can be planarized using a process such as CMP. According to an exemplary embodiment, this CMP step serves to remove the sacrificial gate hardmasks 401 thereby exposing the underlying sacrificial gates 402.

Figure 8A:
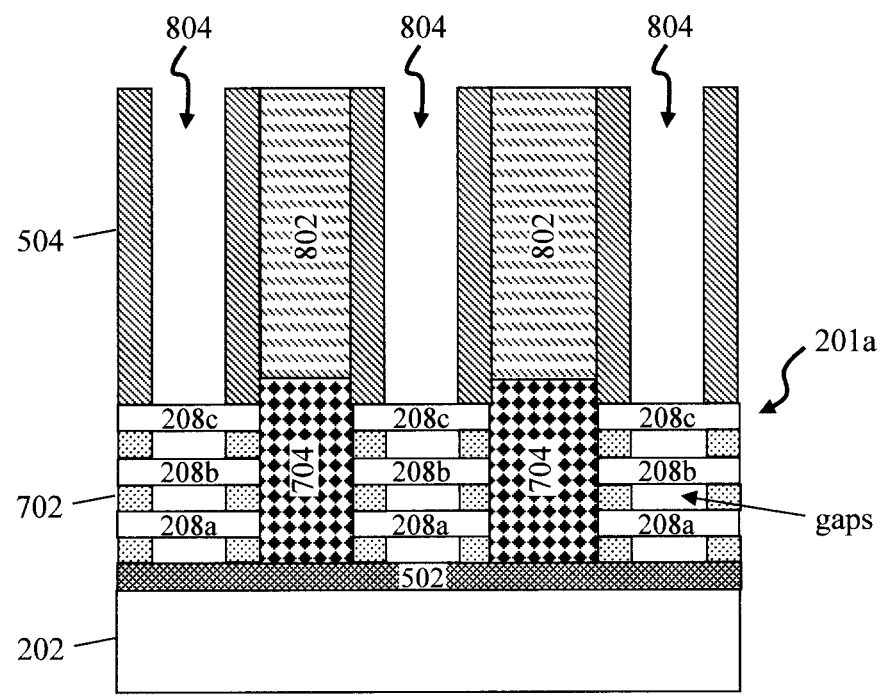
FIG. 8A is a cross-sectional diagram illustrating the sacrificial gates having been surrounded in a (first) interlayer dielectric (ILD), the sacrificial gates having been selectively removed forming gate trenches in the first ILD over the device stacks in between the source and drains, the second sacrificial layers having been selectively removed forming gaps in the device stacks in between the active layers from a view perpendicular to the gates.

Sacrificial gates 402 are then selectively removed forming gate trenches 804 in the ILD 802 over the device stacks 201a,b, etc. in between the source and drains 704. See FIG. 8A (a cross-sectional view X). As shown in FIG. 8A, the sacrificial layers 206a,b,c, etc., now accessible through gate trenches 804, are then selectively removed. Removal of sacrificial layers 206a,b,c, etc. releases the active layers 208a,b,c, etc. from the device stacks 201a,b, etc. in the channel region of the semiconductor FET device. Gaps are now present in the device stacks 201a,b, etc. in between the active layers 208a,b,c, etc. in the channel region of the device. Active layers 208a,b,c, etc. will be used to form the channels of the semiconductor FET device. As will be described in detail below, replacement metal gates, i.e., including a gate dielectric and at least one workfunction-setting metal, will be formed in the gate trenches 804 and the gaps that fully surround a portion of each of the active layers 208a,b,c, etc. in a gate-all-around (GAA) configuration.

Figure 8B:
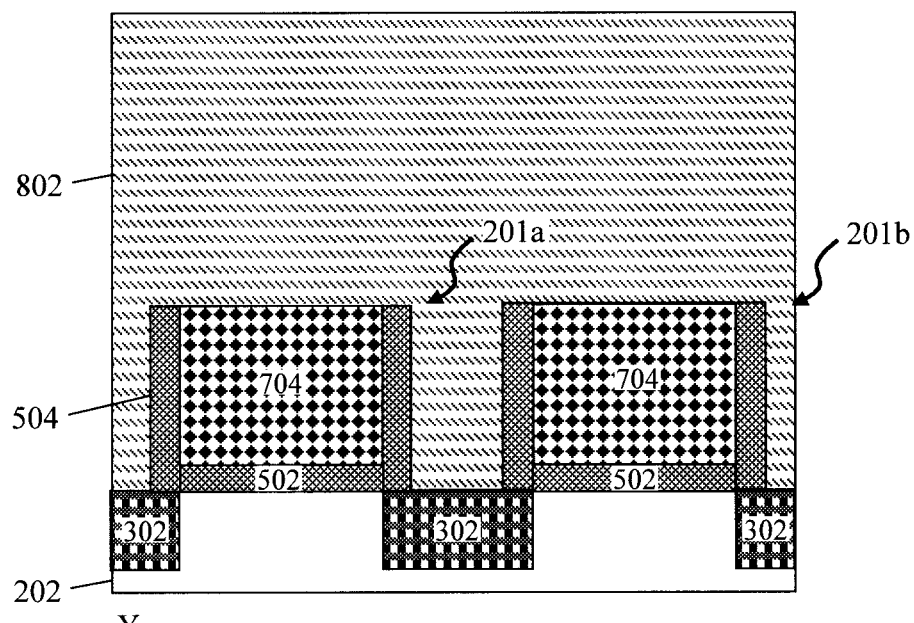
FIG. 8B is a cross-sectional diagram illustrating the first ILD having been deposited over the source and drains from a view parallel to/in between the gates according to an embodiment of the present invention.

FIG. 8B (a cross-sectional view Y) illustrates ILD 802 from another perspective, i.e., between two of the sacrificial gates 402 and through the source and drain epitaxy. As shown in FIG. 8B, ILD 802 covers the source and drains 704.

Formation of the replacement metal gates begins with the deposition of a conformal gate dielectric 902 into and lining each of the gate trenches 804 and gaps with the conformal gate dielectric 902 being disposed on the active layers 208a,b,c, etc. in the channel region of the semiconductor FET device. See FIG. 9 (a cross-sectional view X). According to an exemplary embodiment, gate dielectric 902 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as CVD, ALD or PVD can be employed to deposit the gate dielectric 902 into the gate trenches 804 and gaps. According to an exemplary embodiment, gate dielectric 902 has a thickness of from about 1 nanometer (nm) to about 5 nm and ranges therebetween. A reliability anneal can be performed following deposition of gate dielectric 902. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as nitrogen.

At least one workfunction-setting metal 904 is then deposited into the gate trenches 804 and gaps over the gate dielectric 902. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal(s) 904, after which the metal overburden can be removed using a process such as CMP.

Figure 9:
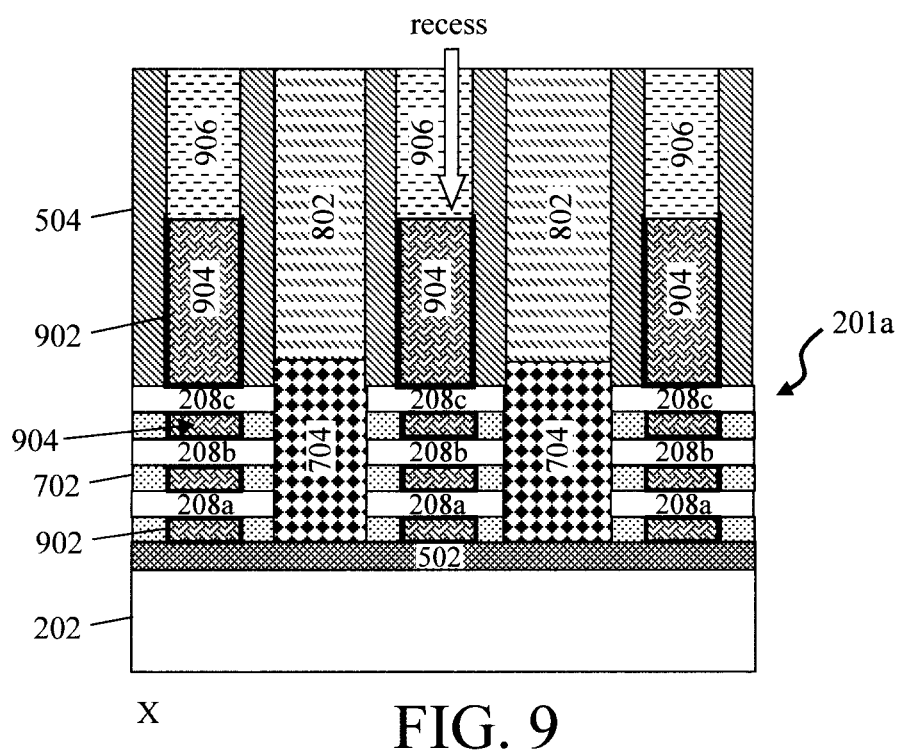
FIG. 9 is a cross-sectional diagram illustrating a conformal gate dielectric having been deposited into and lining each of the gate trenches and gaps, at least one workfunction-setting metal having been deposited into the gate trenches and gaps over the gate dielectric to form replacement metal gates, the gate dielectric and workfunction-setting metal(s) having been recessed, and dielectric caps having been formed in the gate trenches over the (recessed) gate dielectric and workfunction-setting metal(s) from a view perpendicular to the gates according to an embodiment of the present invention.

As shown in FIG. 9, the gate dielectric 902 and workfunction-setting metal(s) 904 are recessed, and dielectric caps 906 are formed in gate trenches 804 over the (recessed) gate dielectric 902 and workfunction-setting metal(s) 904. Suitable materials for dielectric caps 906 include, but are not limited to, SiOx and/or SiN. A process such as CVD, ALD or PVD can be employed to deposit the dielectric cap material into gate trenches 804, after which the material can be planarized using a process such as CMP. Now present is a structure including at least one gate (i.e., replacement metal gates—gate dielectric 902 and workfunction-setting metal(s) 904) with source and drains 704 on opposite sides of the at least one gate, and a channel(s) (i.e., active layers 208a,b,c, etc.) interconnecting the source and drains 704. Source and drain contacts will next be formed. The dielectric caps 906 will protect the underlying replacement metal gates (i.e., gate dielectric 902 and workfunction-setting metal(s) 904) during source and drain contact formation.

Figure 10A:
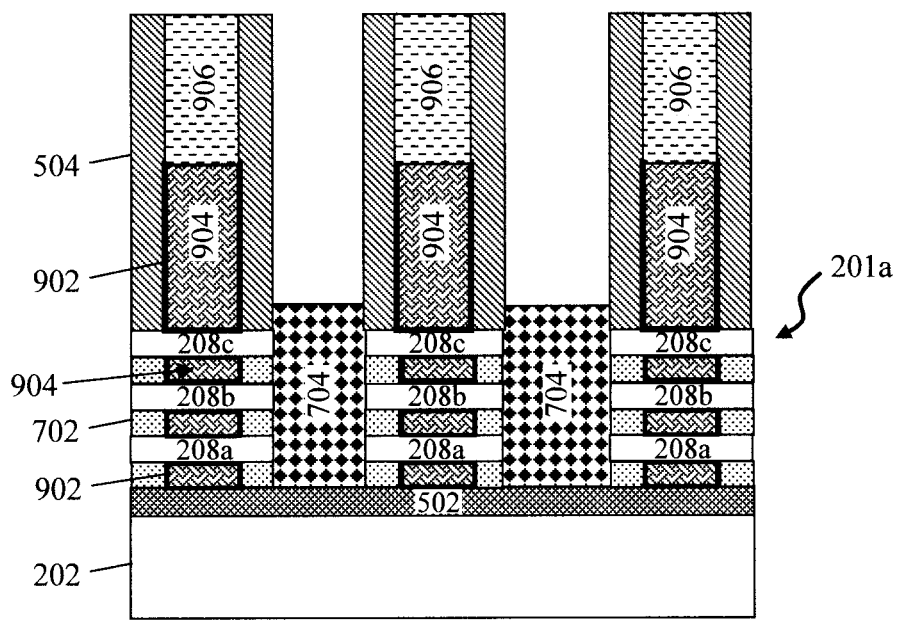
FIG. 10A is a cross-sectional diagram illustrating an etch back of the first ILD having been performed from a view perpendicular to the gates.

To form the source and drain contacts, an etch back of the ILD 802 is next performed. See FIG. 10A (a cross-sectional view X). A non-directional (isotropic) etching process such as a wet chemical etch can be employed for the etch back of ILD 802. As shown in FIG. 10A, the etch back fully removes the ILD 802 from the top of the source and drains 704. Dielectric spacers 504 and dielectric caps 906 serve to protect the replacement metal gates (i.e., gate dielectric 902 and workfunction-setting metal(s) 904) during the etch back of ILD 802.

Figure 10B:
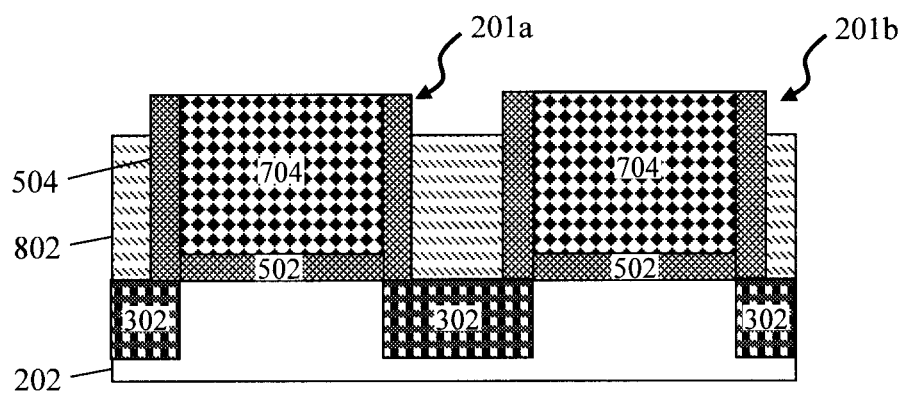
FIG. 10B is a cross-sectional diagram illustrating the etch back of the first ILD having been performed from a view parallel to/in between the gates according to an embodiment of the present invention.

FIG. 10B (a cross-sectional view Y) illustrates the etch back of ILD 802 from another perspective, i.e., between two of the replacement metal gates and through the source and drain epitaxy. As shown in FIG. 10B, the etch back recesses the ILD 802 below the top surfaces of the source and drains 704. However, portion of the ILD 802 can remain alongside/in-between the source and drains 704.

Figure 11A:
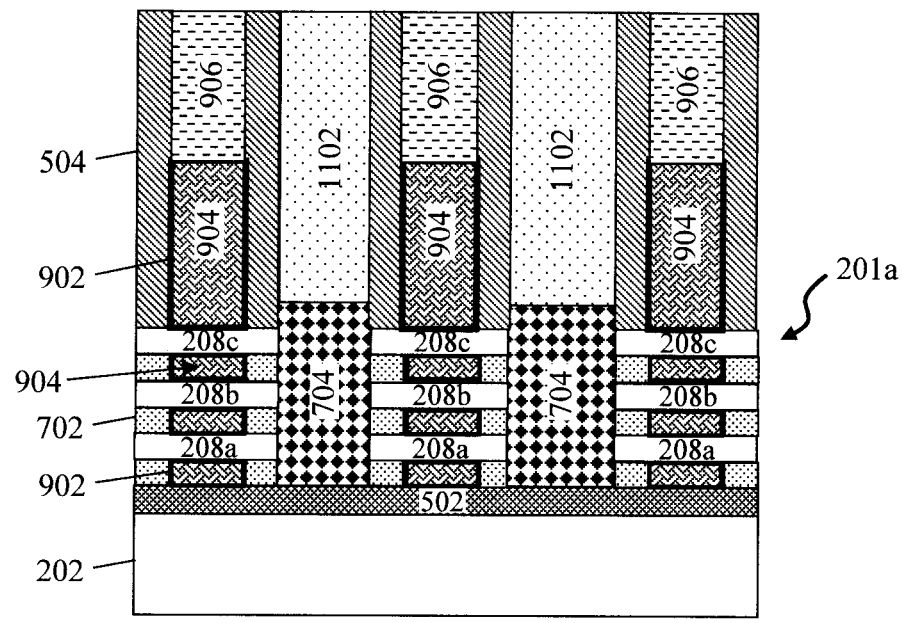
FIG. 11A is a cross-sectional diagram illustrating an OPL having been deposited in between the replacement metal gates over the source and drains and then etched back from a view perpendicular to the gates.

An OPL 1102 is then deposited in between the replacement metal gates over the source and drains 704. See FIG. 11A (a cross-sectional view X). A process such as spin-on coating, CVD, ALD or PVD can be employed to deposit the OPL 1102. Following deposition, the OPL 1102 is preferably etched back to expose the tops of dielectric spacers 504 and dielectric caps 906 as shown in FIG. 11A. A process such as CMP can be employed for the OPL etch back.

Figure 11B:
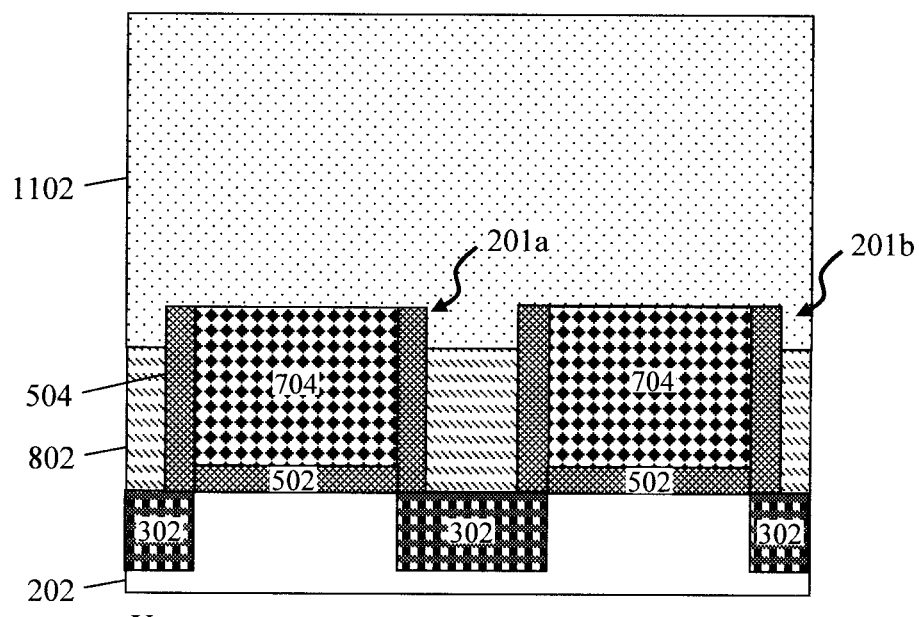
FIG. 11B is a cross-sectional diagram illustrating the OPL having been deposited over the source and drains and then etched back from a view parallel to/in between the gates according to an embodiment of the present invention.

FIG. 11B (a cross-sectional view Y) illustrates OPL 1102 having been deposited over the source and drains 704 from another perspective, i.e., between two of the replacement metal gates and through the source and drain epitaxy. As shown in FIG. 11B, OPL 1102 is disposed on the (recessed) ILD 802.

Figure 12A:
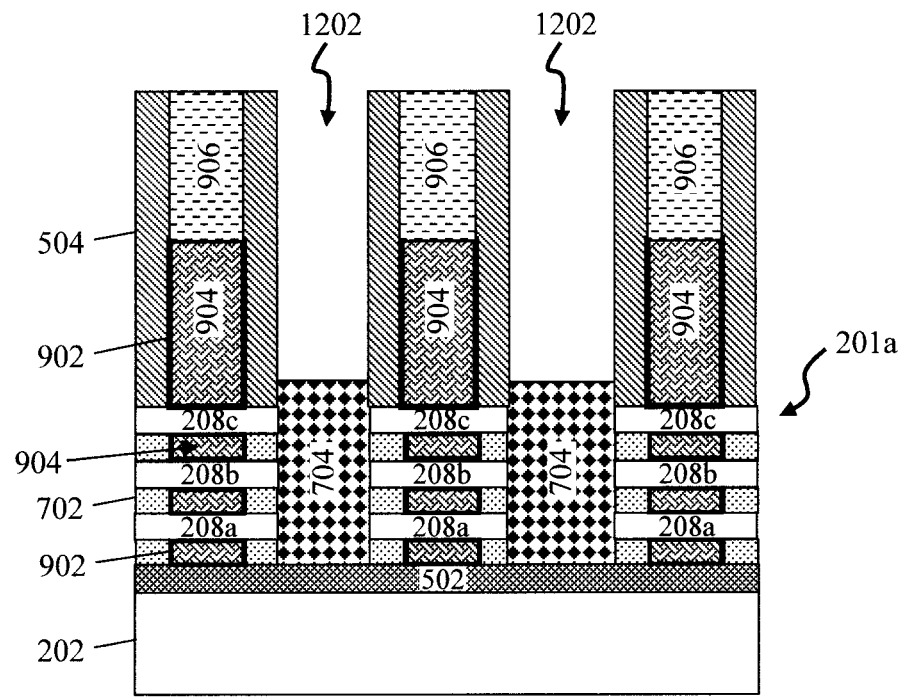
FIG. 12A is a cross-sectional diagram illustrating (first) contact trenches having been patterned in the OPL in between the replacement metal gates over the source and drains from a view perpendicular to the gates.

Deposition of the OPL 1102 permits contact trenches to be formed selectively over the source and drains 704. Namely, as shown in FIG. 12A (a cross-sectional view X), contact trenches 1202 are patterned in the OPL 1102 in between the replacement metal gates over the source and drains 704. A directional (anisotropic) etching process such as RIE can be employed for the contact trench 1202 patterning. Notably, as shown in FIG. 12A, in an x-direction (see below) the sidewalls of contact trenches 1202 are formed by dielectric spacers 504.

Figure 12B:
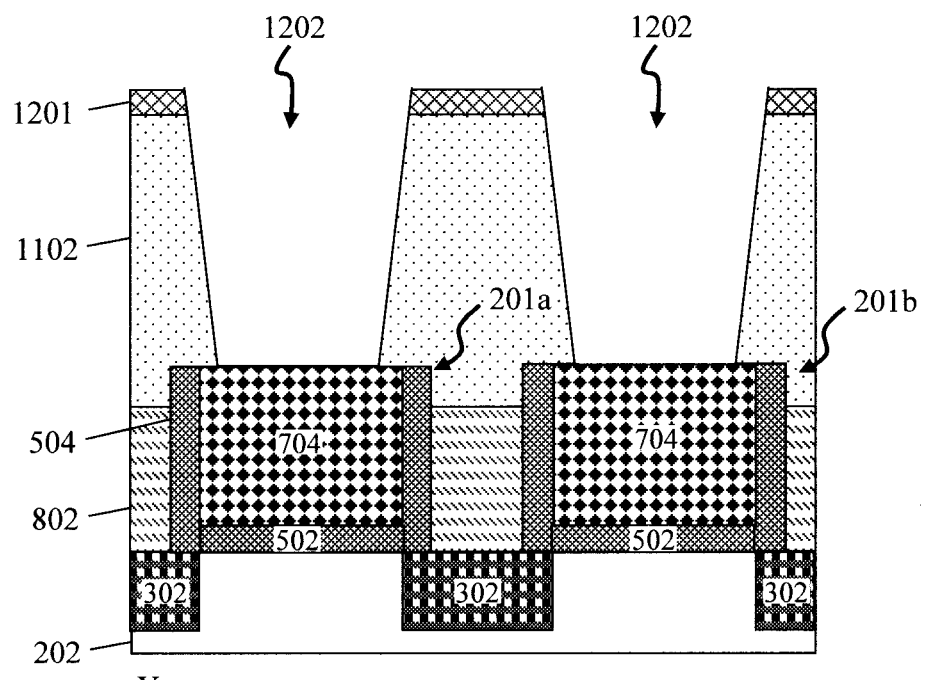
FIG. 12B is a cross-sectional diagram illustrating the first contact trenches having been patterned in the OPL over the source and drains from a view parallel to/in between the gates according to an embodiment of the present invention.

FIG. 12B (a cross-sectional view Y) illustrates formation of the contact trenches 1202 in OPL 1102 from another perspective, i.e., between two of the replacement metal gates and through the source and drain epitaxy. As shown in FIG. 12B, patterning of the contact trenches 1202 in OPL 1102 involves first patterning a hardmask 1201 on the OPL 1102 marking the footprint and location of each of the contact trenches 1202. Suitable materials for hardmask 1201 include, but are not limited to, SiON, titanium oxide (TiOx) and/or a low-temperature oxide (LTO). As provided above, a directional (anisotropic) etching process such as RIE is then employed to pattern the contact trenches 1202 in OPL 1102 using the hardmask 1201 which extend down to the source and drains 704. See FIG. 12B. Notably, as shown in FIG. 12B, in an y-direction (see below) the sidewalls of contact trenches 1202 are formed by OPL 1102.

Sacrificial spacers 1302 are then formed lining the sidewalls of the contact trenches 1202, followed by a recess etch of the source and drains 704. See FIG. 13A (a cross-sectional view X). The sacrificial spacers 1302 protect the underlying source and drains 704 to ensure that, following the recess etch of the source and drains 704, a portion of the source and drains 704 remains beneath the sacrificial spacers 1302 in contact with the active layers 208a,b,c, etc. Suitable materials for the sacrificial spacers 1302 include, but are not limited to, metal oxides such as TiOx, tantalum oxide (TaOx), aluminum oxide (AlOx), titanium nitride (TiN) and/or room temperature SiOx. According to an exemplary embodiment, the sacrificial spacers 1302 have a thickness of from about 1 nm to about 5 nm and ranges therebetween. By way of example only, the sacrificial spacers 1302 can be formed using conformal deposition followed by an anisotropic etching process such that the sacrificial spacer material over horizontal surfaces is removed.

Figure 13A:
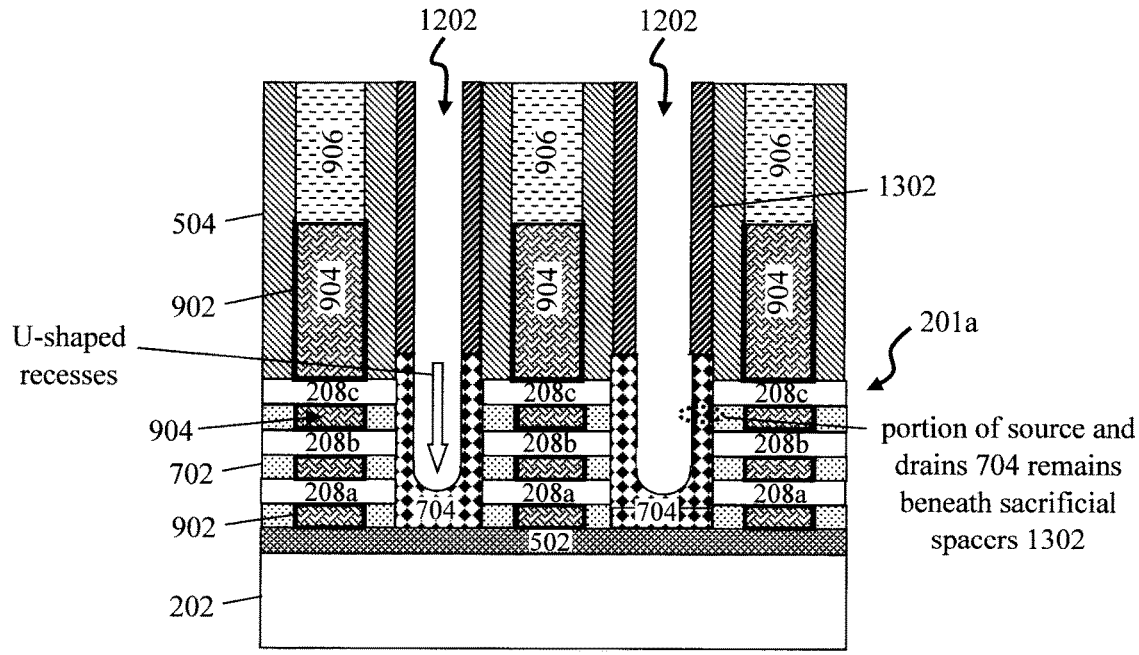
FIG. 13A is a cross-sectional diagram illustrating sacrificial spacers having been formed lining the sidewalls of the first contact trenches, followed by the formation of (U-shaped) recesses in the source and drains from a view perpendicular to the gates.

An etch is then performed between the sacrificial spacers 1302 to recess the source and drains 704. According to an exemplary embodiment, the etch forms U-shaped recesses in the source and drains 704. A U-shaped recess in the source and drains 704 can be formed using a dry etching process. Advantageously, recessing the source and drains 704 in this manner vastly increases their overall contact area. Namely, prior to the recess etch, the contact area consisted of the top horizontal surfaces of the source and drains 704 (see, e.g., FIG. 12A). As shown in FIG. 13A, following the recess etch the contact area includes both vertical and horizontal surfaces along the sidewalls and at the bottom of the recesses, respectively. As provided above, sacrificial spacers 1302 protect portions of the source and drains 704 along the sidewalls of the recesses during the etch.

Figure 13B:
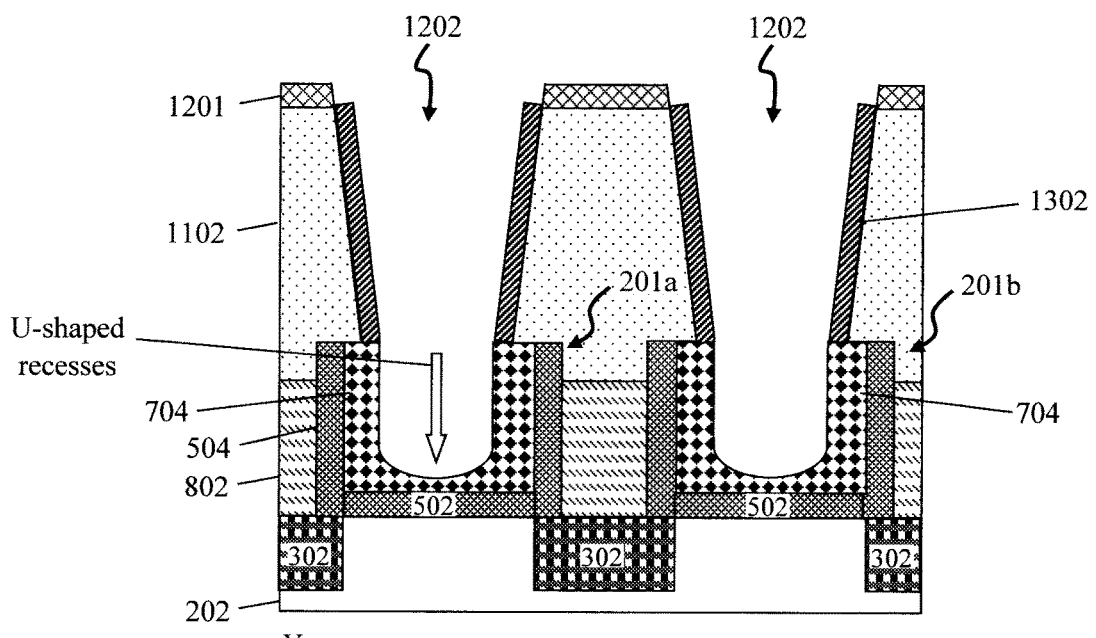
FIG. 13B is a cross-sectional diagram illustrating the sacrificial spacers having been formed lining the sidewalls of the first contact trenches, followed by the formation of the (U-shaped) recesses in the source and drains from a view parallel to/in between the gates according to an embodiment of the present invention.

FIG. 13B (a cross-sectional view Y) illustrates sacrificial spacers 1302 having been formed along the sidewalls of the contact trenches 1202 and (e.g., U-shaped) recesses having been formed in the source and drains 704 between the sacrificial spacers 1302 from another perspective, i.e., between two of the replacement metal gates and through the source and drain epitaxy. As shown in FIG. 13B, sacrificial spacers 1302 serve to preserve portions of the source and drains 704 along the sidewalls of the recesses.

Figure 14A:
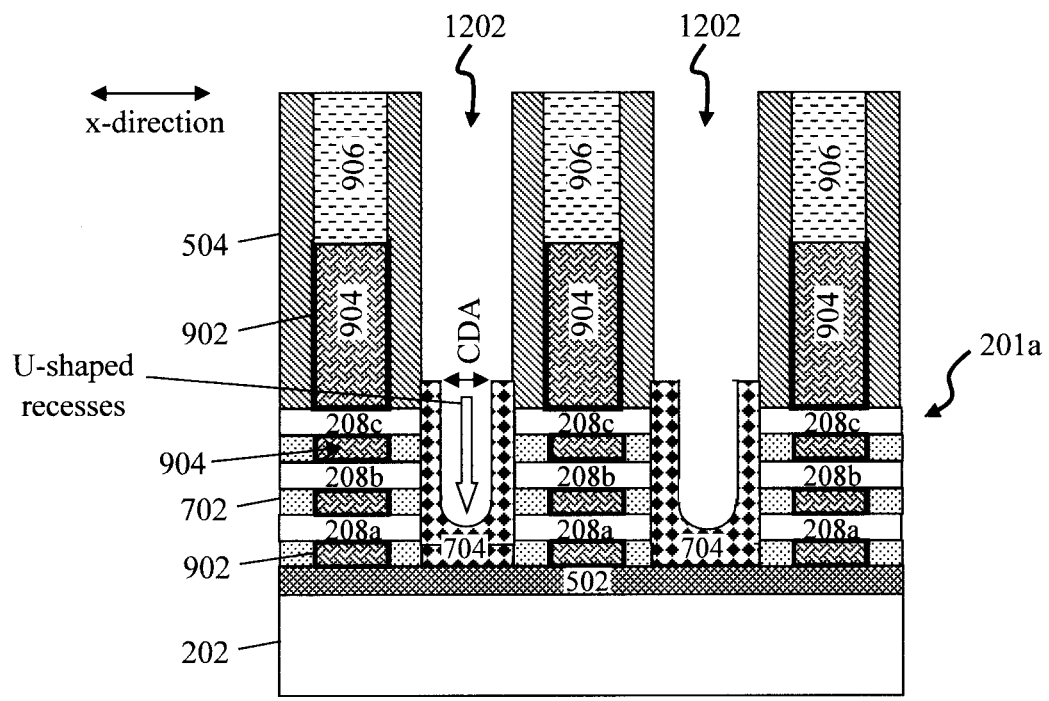
FIG. 14A is a cross-sectional diagram illustrating the sacrificial spacers having been removed from a view perpendicular to the gates.

Following formation of the (e.g., U-shaped) recesses, sacrificial spacers 1302 are removed using a selective etching process such as an SC1 wet clean. See FIG. 14A (a cross-sectional view X). As shown in FIG. 14A, the recesses have a (first) critical dimension CDA (i.e., width at the top of the recesses) in a (first) x-direction. The x-direction corresponds to the cross-sectional view X and the CDA in the x-direction refers to the CD of the recesses perpendicular to the replacement metal gates (i.e., gate dielectric 902 and workfunction-setting metal(s) 904). According to an exemplary embodiment, CDA is from about 5 nm to about 20 nm and ranges therebetween. As will be described in detail below, a CDB in a (second) y-direction will be selectively reduced to help minimize the overall contact footprint and contact-to-gate parasitic capacitance. By 'selectively reduced' it is meant that CDB is reduced while CDA remains unchanged. The x-direction and the y-direction are perpendicular to one another.

Figure 14B:
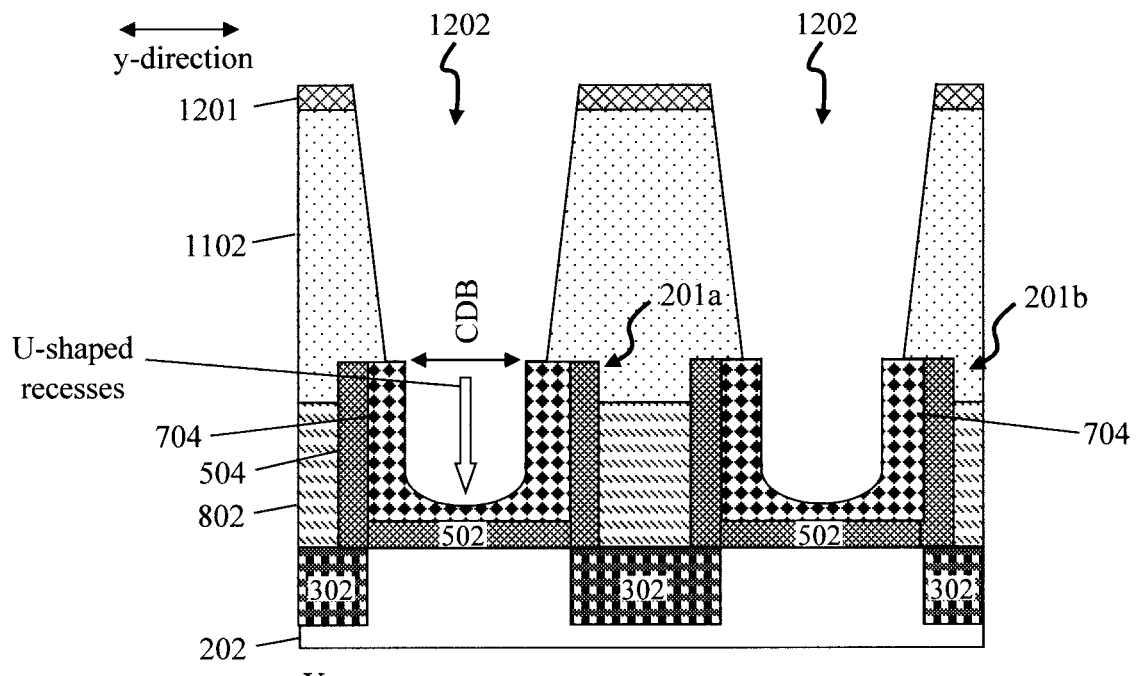
FIG. 14B is a cross-sectional diagram illustrating the sacrificial spacers having been removed from a view parallel to/in between the gates according to an embodiment of the present invention.

FIG. 14B (a cross-sectional view Y) illustrates sacrificial spacers 1302 having been removed from another perspective, i.e., between two of the replacement metal gates and through the source and drain epitaxy. As shown in FIG. 14B, the recesses have a (second) critical dimension CDB (i.e., width at the top of the recesses) in a y-direction. The y-direction corresponds to the cross-sectional view Y and the CDB in the y-direction refers to the CD of the recesses in between/parallel to the replacement metal gates (i.e., gate dielectric 902 and workfunction-setting metal(s) 904). CDB is greater than CDA (see FIG. 14A), i.e., CDB>CDA. According to an exemplary embodiment, CDB is from about 10 nm to about 50 nm and ranges therebetween. However, as will be described in detail below, CDB will be selectively reduced, e.g., to CDB', above the recesses such that portions of the metal contacts formed above the source and drains 704 (see below) will have the (reduced) width CDB'.

Growth of a self-aligned material (SAM)/polymer brush material will be used to selectively reduce CDB in the y-direction. This technique leverages the ability of the SAM/polymer brush material to selectively graft onto OPL 1102 and not on other materials such as the dielectric spacers 504 and dielectric caps 906. Notably, OPL 1102 is now only present in the y-direction (see FIG. 15B described below). Thus, in other words, the SAM/polymer brush material will graft to the OPL 1102 in the contact trenches 1202 in the y-direction, and no SAM/polymer brush material will be present in the contact trenches 1202 in the x-direction.

Figure 15A:
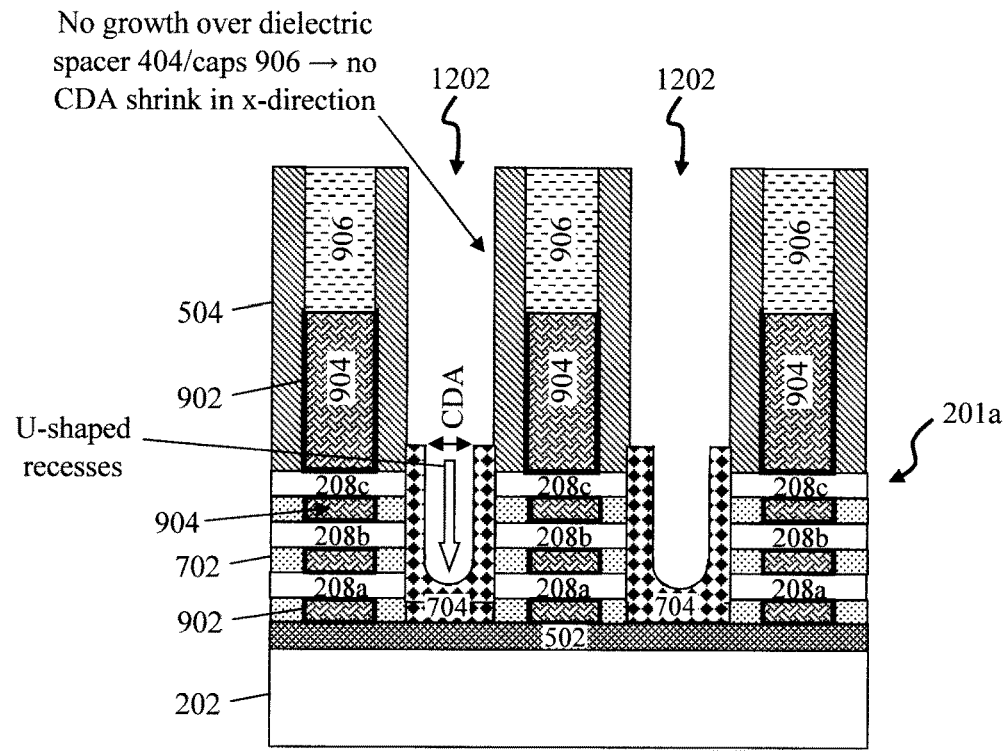
FIG. 15A is a cross-sectional diagram illustrating that no growth of a SAM/polymer brush material occurs on the dielectric spacers and dielectric caps in an x-direction from a view perpendicular to the gates.

Namely, as shown in FIG. 15A (a cross-sectional view X) there is no growth of the SAM/polymer brush material on the dielectric spacers 504 and dielectric caps 906. As such, there is no CD shrink in the x-direction. Thus, the CD of the recesses in the source and drains 704 perpendicular to the replacement metal gates (i.e., gate dielectric 902 and workfunction-setting metal(s) 904) remains at CDA.

Figure 15B:
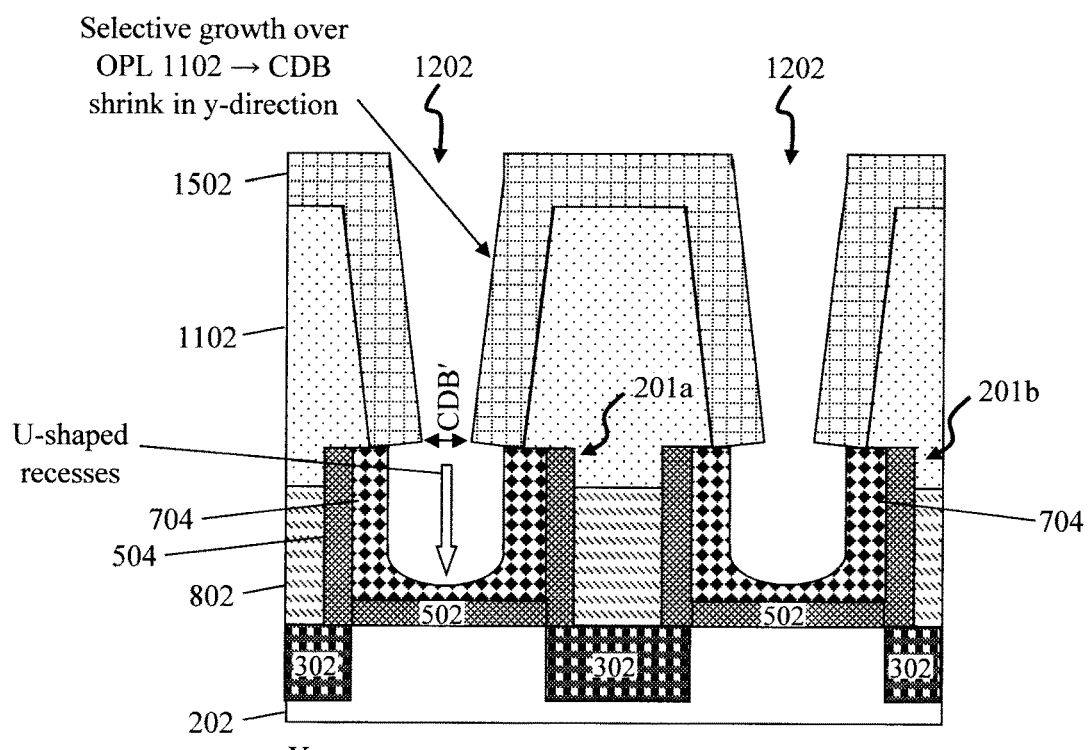
FIG. 15B is a cross-sectional diagram illustrating that the SAM/polymer brush material grows selectively over the OPL in a y-direction from a view parallel to/in between the gates according to an embodiment of the present invention.

By contrast, as shown in FIG. 15B (a cross-sectional view Y), the SAM/polymer brush material 1502 grows selectively over the OPL 1102. Based on this selective growth, there is CD shrink in the y-direction. Namely, the CD of the opening over the recesses in the source and drains 704 in between/ parallel to the replacement metal gates (i.e., gate dielectric 902 and workfunction-setting metal(s) 904) is reduced from CDB (see FIG. 14B) to CDB' (see FIG. 15B), i.e., CDB>CDB'. According to an exemplary embodiment, CDB' is from about 5 nm to about 45 nm and ranges therebetween. According to an exemplary embodiment, the SAM/polymer brush material 1502 is formed with a functional head group that binds to pendant groups in the OPL 902 such as alkyne groups and has an organic tail with one or more hydrophobic repeating units such as alkene, styrene and/or methyl styrene moieties. In one exemplary embodiment, the molecular weight of the SAM/polymer brush material 1502 is from about 500 grams per mole (g/mol) to about 5000 g/mol and ranges therebetween. A casting process such as spin-coating can be employed to deposit a coating of the SAM/polymer brush material 1502 onto OPL 1102 which will self-assemble into a monolayer coating the OPL 1102.

Figure 16A:
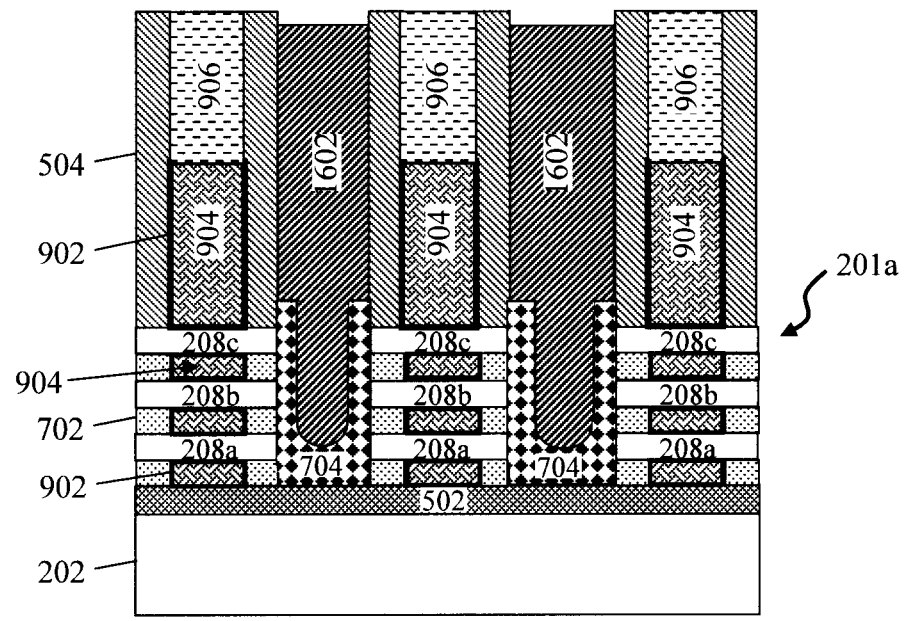
FIG. 16A is a cross-sectional diagram illustrating a sacrificial fill material having been deposited into, and filling the first contact trenches and recesses from a view perpendicular to the gates.

A sacrificial fill material 1602 is then deposited into, and filling the contact trenches 1202 and the recesses in the source and drains 704. See FIG. 16A (a cross-sectional view X). Suitable sacrificial fill materials 1602 include, but are not limited to, metal oxides such as TiOx and/or TaOx. A process such as CVD, ALD or PVD can be employed to deposit the sacrificial fill material 1602 into the contact trenches 1202 and recesses. Following deposition, the sacrificial fill material 1602 is etched-back using a process such as CMP or a wet chemical etch. As shown in FIG. 16A, a CMP with over-polishing or wet chemical etching can result in the sacrificial fill material 1602 being recessed below the top surface of the dielectric spacers 504 and dielectric caps 906.

Figure 16B:
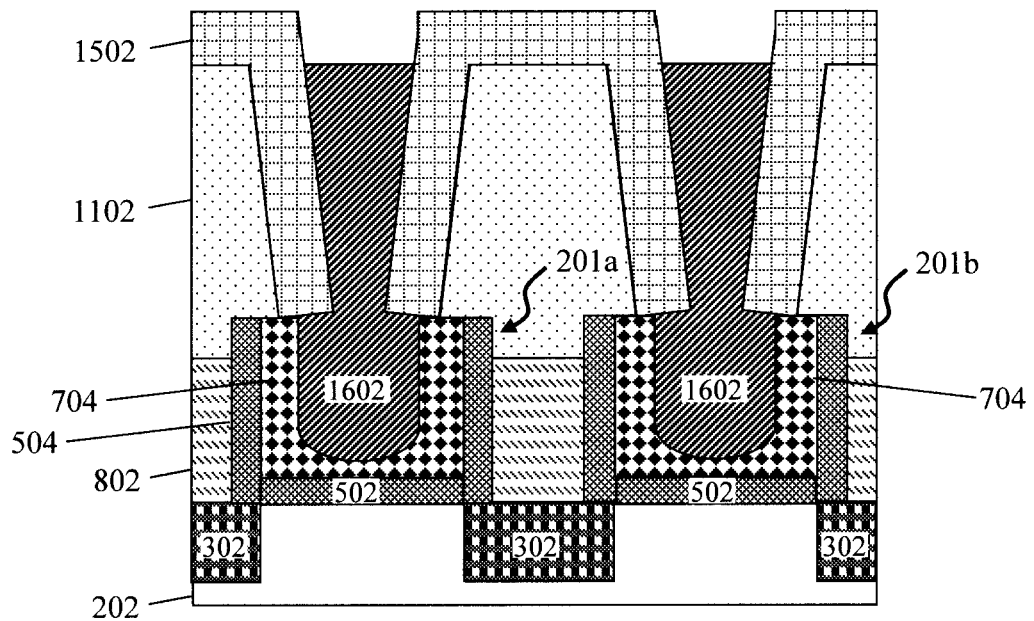
FIG. 16B is a cross-sectional diagram illustrating the sacrificial fill material having been deposited into, and filling the first contact trenches and recesses from a view parallel to/in between the gates according to an embodiment of the present invention.
Figure 17:
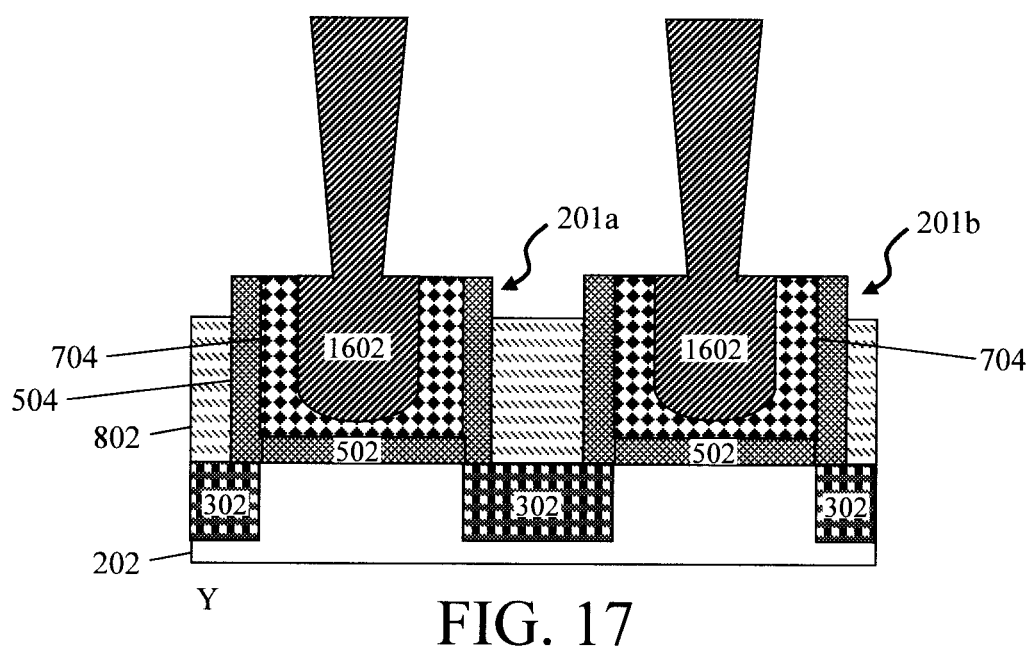
FIG. 17 is a cross-sectional diagram illustrating the OPL and SAM/polymer brush material having been selectively removed from a view parallel to/in between the gates according to an embodiment of the present invention.

FIG. 16B (a cross-sectional view Y) illustrates the sacrificial fill material 1602 having been deposited into, and filling the contact trenches 1202 and recesses, followed by the etch-back from another perspective, i.e., between two of the replacement metal gates and through the source and drain epitaxy. As shown in FIG. 16B, a CMP with over-polishing or wet chemical etching can result in the sacrificial fill material 1602 being recessed below the top surface of the SAM/polymer brush material 1502.

The OPL 1102 and SAM/polymer brush material 1502 are then selectively removed. See FIG. 17 (a cross-sectional view Y). By way of example only, the OPL 1102 and SAM/polymer brush material 1502 can both be selectively removed using a process such as ashing. As will be described in detail below, an ILD will be placed over the source and drains 704 in the y-direction, after which the sacrificial fill material 1602 will be selectively removed and replaced with metal contacts. Notably, based on the unique shape of the sacrificial fill material 1602 including the CD shrink in the y-direction from CDB to CDB' (see above), the metal contacts will also have this unique design.

Figure 18A:
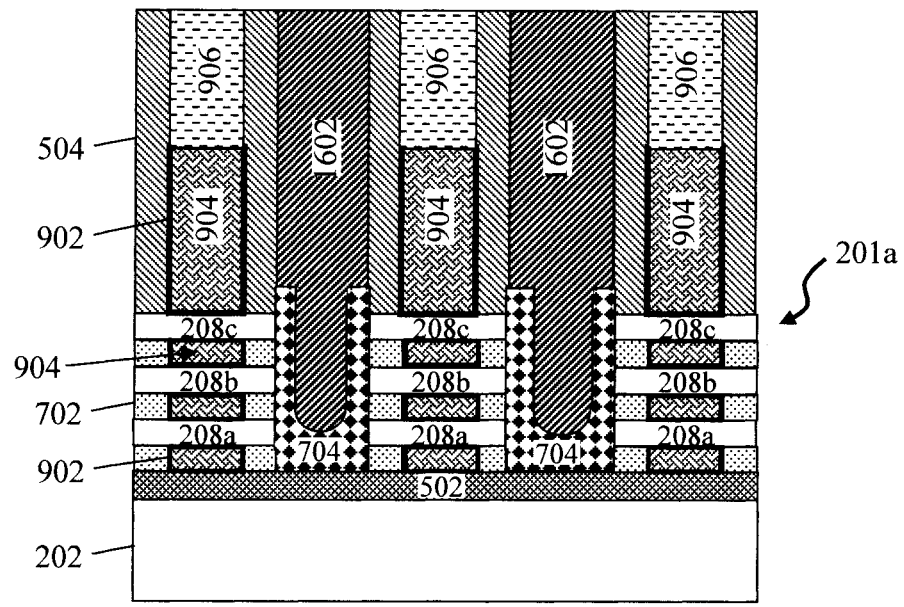
FIG. 18A is a cross-sectional diagram illustrating a (second) ILD having been deposited over the source and drains from a view perpendicular to the gates.

Namely, an ILD 1802 is next deposited over the source and drains 704. For clarity, ILD 1802 may also be referred to herein as a 'second' ILD whereby ILD 802 (see above) is the 'first' ILD. As provided above, suitable ILD materials include, but are not limited to, oxide low-κ materials such as SiOx and/or oxide ULK-ILD materials such as pSiCOH. A process such as CVD, ALD or PVD can be employed to deposit ILD 1802 over the source and drains 704. Following deposition, ILD 1802 can be planarized using a process such as CMP. Following the CMP, ILD 1802 is not present in the x-direction. See FIG. 18A (a cross-sectional view X). However, as shown in FIG. 18A, the CMP recesses dielectric spacers 504 and dielectric caps 906 down to sacrificial fill material 1602 (e.g., compare FIG. 16A and FIG. 18A). According to an exemplary embodiment, dielectric spacers 504 and dielectric caps 906 are now coplanar with the sacrificial fill material 1602 in the x-direction.

Figure 18B:
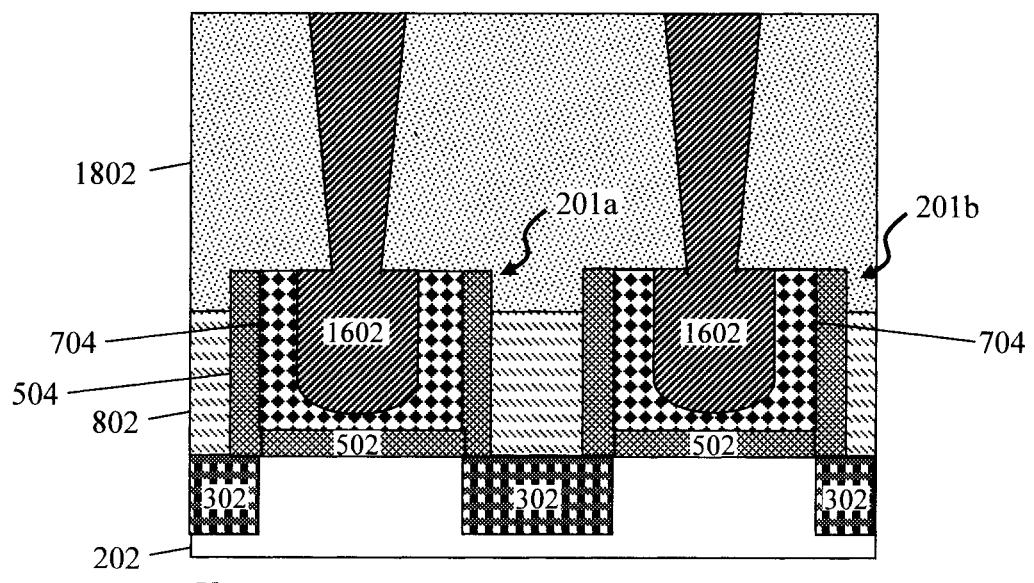
FIG. 18B is a cross-sectional diagram illustrating the second ILD having been deposited over the source and drains from a view parallel to/in between the gates according to an embodiment of the present invention.

FIG. 18B (a cross-sectional view Y) illustrates ILD 1802 having been deposited over the source and drains 704 followed by CMP in the y-direction. As shown in FIG. 18B, in the y-direction the sacrificial fill material 1602 is now bound on either side thereof by ILD 1802. By comparison, in the x-direction the sacrificial fill material 1602 is bound on either side thereof by dielectric spacers 504.

Figure 19A:
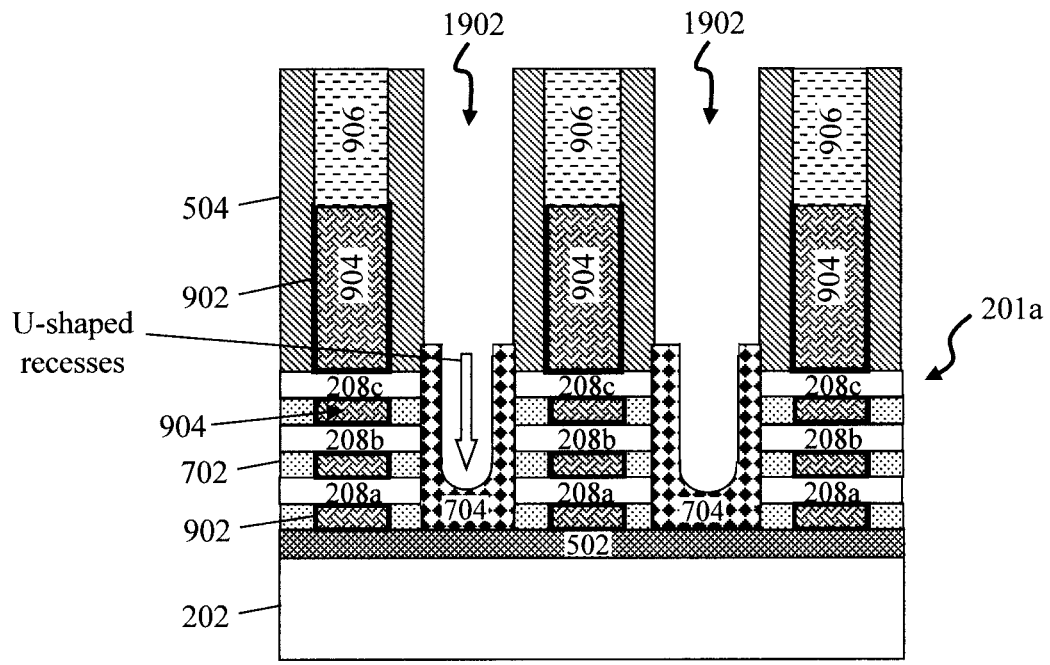
FIG. 19A is a cross-sectional diagram illustrating the sacrificial fill material having been selectively removed, forming (second) contact trenches over the source and drains from a view perpendicular to the gates.

The sacrificial fill material 1602 is then selectively removed, forming contact trenches 1902 over the source and drains 704 and aligned with the recesses. See FIG. 19A (a cross-sectional view X). For clarity, contact trenches 1902 may also be referred to herein as 'second' contact trenches whereby contact trenches 1202 (see above) are the 'first' contact trenches. A wet chemical etch may be employed to remove the sacrificial fill material 1602. Notably, as shown in FIG. 19A, the sidewalls of the contact trenches 1902 are formed by dielectric spacers 504 in the x-direction.

Figure 19B:
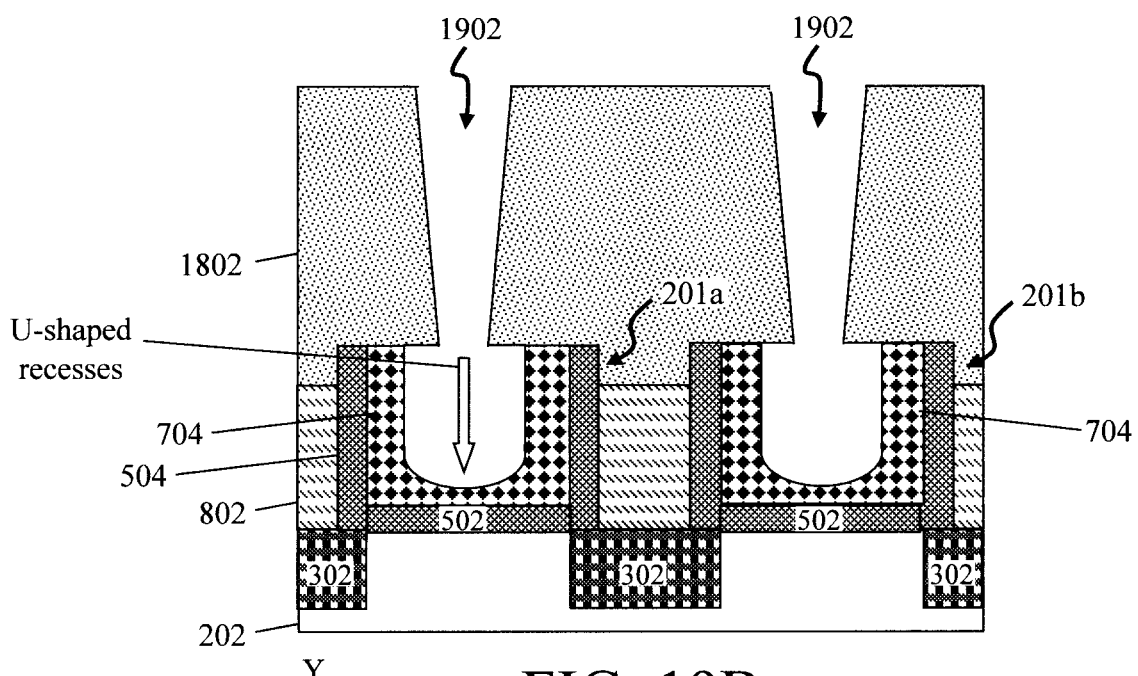
FIG. 19B is a cross-sectional diagram illustrating the sacrificial fill material having been selectively removed, forming the second contact trenches over the source and drains from a view parallel to/in between the gates according to an embodiment of the present invention.

FIG. 19B (a cross-sectional view Y) illustrates the sacrificial fill material having been selectively removed, forming the contact trenches 1902 over the source and drains 704 and aligned with the recesses from another perspective, i.e., between two of the replacement metal gates and through the source and drain epitaxy. Notably, as shown in FIG. 19B, the sidewalls of the contact trenches 1902 are formed by ILD 1802 in the y-direction.

A contact metal (or combination of contact metals) are then deposited into and filling the contact trenches 1902 and recesses, forming metal contacts 2002 over the source and drains 704 and in the recesses. See FIG. 20A (a cross-sectional view X). Suitable contact metals include, but are not limited to, copper (Cu), tungsten (W), ruthenium (Ru), cobalt (Co), nickel (Ni) and/or platinum (Pt). The contact metal(s) can be deposited into the contact trenches 1902 and recesses using a process such as evaporation, sputtering, or electrochemical plating. Following deposition, the overburden can be removed using a process such as CMP.

Figure 20A:
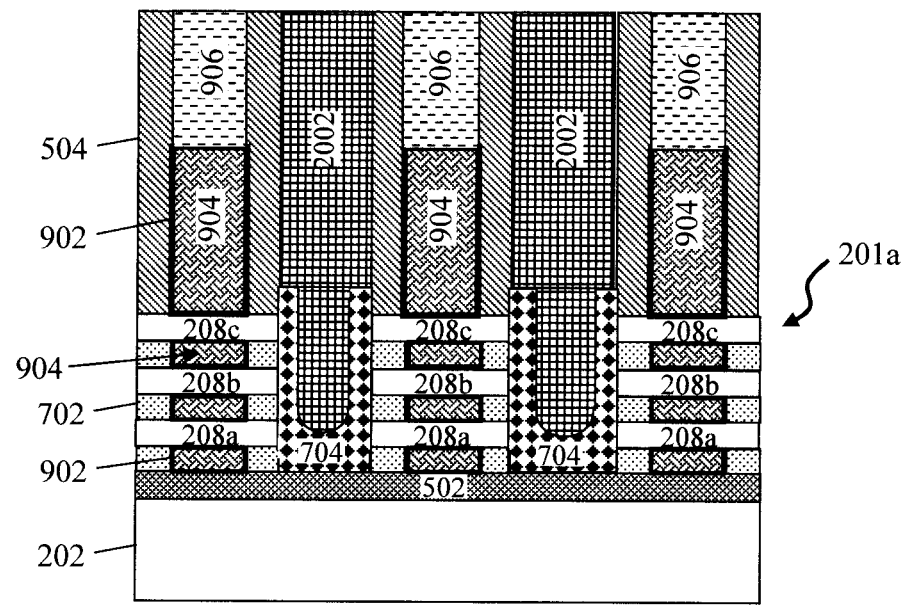
FIG. 20A is a cross-sectional diagram illustrating a contact metal(s) having been deposited into and filling the contact trenches and recesses, forming metal contacts over the source and drains and in the recesses from a view perpendicular to the gates.
Figure 20B:
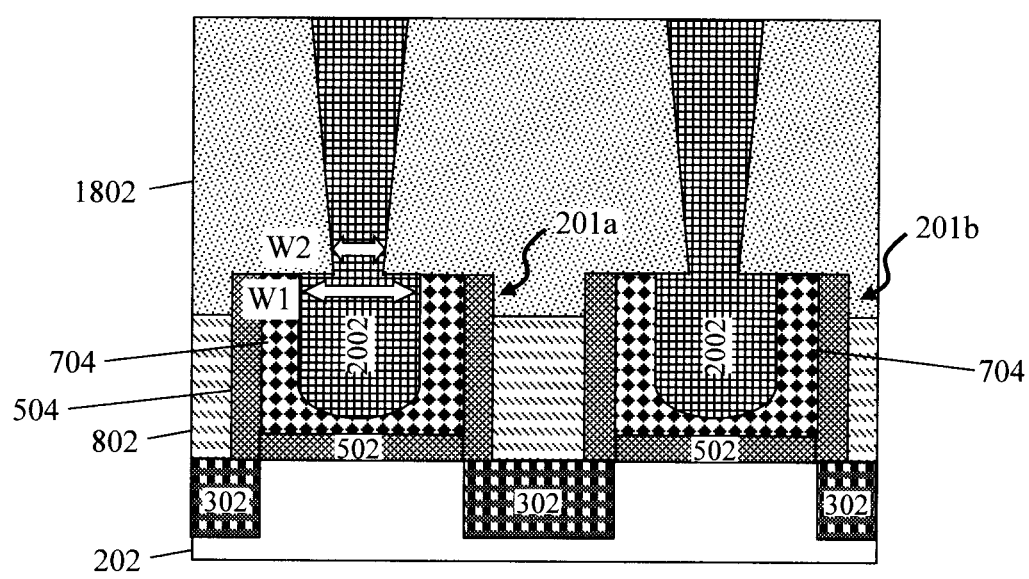
FIG. 20B is a cross-sectional diagram illustrating the contact metal(s) having been deposited into and filling the contact trenches and recesses, forming the metal contacts over the source and drains and in the recesses from a view parallel to/in between the gates according to an embodiment of the present invention.

FIG. 20B (a cross-sectional view Y) illustrates the contact metal(s) having been deposited into and filling the contact trenches 1902 and recesses to form the metal contacts 2002 over the source and drains 704 and in the recesses from another perspective, i.e., between two of the replacement metal gates and through the source and drain epitaxy. Notably, referring to FIG. 20A and FIG. 20B it can be seen that metal contacts 2002 are in direct contact with a bottom and sidewalls of each of the recesses in both the x-direction and the y-direction, respectively. Advantageously, this contact design serves to maximize the contact area.

Further, as highlighted above, based on the present fabrication process including the CD shrink in the y-direction from CDB to CDB' (see above), the metal contacts 2002 have a unique and advantageous design. For instance, as shown in FIG. 20B, in the y-direction the metal contacts 2002 have a first width W1 in the recesses and a second (reduced) width W2 (in contact trenches 1902) over the recesses, i.e., W1>W2. Advantageously, this contact design helps to minimize the overall contact footprint and contact-to-gate parasitic capacitance.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor field-effect transistor (FET) device, comprising:
    at least one gate; source and drains on opposite sides of the at least one gate; recesses in the source and drains; and metal contacts disposed over the source and drains and in the recesses, wherein the metal contacts are in direct contact with a bottom and sidewalls of each of the recesses in both a first direction and a second direction, wherein the first direction corresponds to a first vertical cut through the FET device that is perpendicular to the at least one gate and which crosses the metal contacts and the source and drains on the opposite sides of the at least one gate, and wherein the second direction corresponds to a second vertical cut through the FET device that is parallel to the at least one gate and is located through one of the source or drains, wherein the second direction is perpendicular to the first direction, wherein each metal contact includes a head section located within the recess of the source or drain and a shaft section extending above the source or drain, wherein the shaft includes a connecting section that connects the shaft to the head section, wherein the connecting section is wider than the head section in the first direction and the head section is wider than the connecting section in the second direction, the semiconductor FET device further comprising: a bottom dielectric isolation layer on which the source and drains are disposed; and dielectric spacers alongside the source and drains.

2. The semiconductor FET device of claim 1, wherein the recesses are U-shaped.

3. The semiconductor FET device of claim 1, wherein the recesses have a first critical dimension CDA in the first direction, and a second critical dimension CDB in the second direction, wherein CDB>CDA.

4. The semiconductor FET device of claim 3, wherein CDA is from about 5 nm to about 20 nm and ranges therebetween.

5. The semiconductor FET device of claim 3, wherein CDB is from about 10 nm to about 50 nm and ranges therebetween.

6. The semiconductor FET device of claim 3, wherein portions of the metal contacts disposed over the source and drains have a critical dimension CDB' in the second direction, wherein CDB>CDB'.

7. The semiconductor FET device of claim 6, wherein CDB' is from about 5 nm to about 45 nm and ranges therebetween.

8. The semiconductor FET device of claim 1, further comprising:
    at least one channel interconnecting the source and drains.

9. The semiconductor FET device of claim 8, wherein the at least one channel comprises a stack of active layers.

10. The semiconductor FET device of claim 9, wherein the at least one gate surrounds a portion of each of the active layers in a gate-all-around configuration.

11. The semiconductor FET device of claim 9, wherein the active layers comprise silicon (Si).

12. The semiconductor FET device of claim 1, wherein the dielectric spacers are present alongside the source and drains only in the second direction.

13. The semiconductor PET device of claim 1, wherein the metal contacts have tapered sidewalls in the second direction.

14. The semiconductor PET device of claim 1, wherein the metal contacts have straight sidewalls in the first direction.

* * * * *